US006743975B2

(12) United States Patent
Kolb

(10) Patent No.: US 6,743,975 B2
(45) Date of Patent: Jun. 1, 2004

(54) LOW PROFILE NON-ELECTRICALLY-CONDUCTIVE COMPONENT COVER FOR ENCASING CIRCUIT BOARD COMPONENTS TO PREVENT DIRECT CONTACT OF A CONFORMAL EMI SHIELD

(75) Inventor: Lowell Edward Kolb, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/812,662

(22) Filed: Mar. 19, 2001

(65) Prior Publication Data

US 2002/0129957 A1 Sep. 19, 2002

(51) Int. Cl.[7] .................................................. H05K 9/00
(52) U.S. Cl. .................... 174/35 R; 361/816; 174/52.3; 174/52.2
(58) Field of Search .......................... 174/35 R, 35 MS, 174/52.3, 52.2; 361/816, 818, 752, 800

(56) References Cited

U.S. PATENT DOCUMENTS

| | | | | |
|---|---|---|---|---|
| 3,563,933 A | 2/1971 | Stivers | .......................... | 260/41 |
| 3,915,924 A | 10/1975 | Wright | .......................... | 260/37 |
| 4,115,508 A | 9/1978 | Hughes | ........................ | 264/310 |

(List continued on next page.)

OTHER PUBLICATIONS

Hancock, R., Technical Data Sheet, Clear Water Reducilbe Barrier Coat, Product No. CQW–L200DW, rev. 2M, The Egyptian Lacquer Mfg. Co., Mar. 17, 1999.

News Bulletin, "Stop the Noise WIth Tara Recyilcable Shielded Plastic," The Egyptian Lacquer Mfg. Co., Nov. 28, 2000.

Brandt et al., "EMI SHielding in the Circuit Board Level Using Metallurgical Pastes," ISPS'99 Proceedings, Jan. 11, 1999.

* cited by examiner

Primary Examiner—Hung V. Ngo

(57) ABSTRACT

An electrically continuous, grounded conformal EMI protective shield and methods for applying same directly to the surfaces of a printed circuit board. The EMI shield adheres and conforms to the surface of the components and printed wiring board. The shield takes the shape of the covered surfaces while adding little to the dimensions of the surfaces. The EMI shield includes low viscosity, high adherence conductive and dielectric coatings each of which can be applied in one or more layers using conventional spray techniques. The conductive coating prevents substantially all electromagnetic emissions generated by the shielded components from emanating beyond the conformal coating. The dielectric coating is initially applied to selected locations of the printed circuit board so as to be interposed between the conductive coating and the printed circuit board, preventing the conductive coating from electrically contacting selected components and printed wiring board regions. A high viscosity, non-electrically-conductive filler material is applied to printed circuit board regions that have surfaces that are cavitatious and/or which have a highly variable slope. The filler material can be used in conjunction with conformal EMI shield board level coating. The high viscosity, electrically non-conductive filler material substantially covers each cavity such that the covered cavity is inaccessible and that the covered region of the printed circuit board has a contiguous, contoured surface. A pre-manufactured non-electrically-conductive component cover can be mounted over a corresponding component and secured to the printed wiring board. The component cover and printed wiring board surround the component, forming a sealed enclosure. The component cover has a thin cross-section and an interior surface that follows closely the surface of the component. This minimizes the volume enclosed by the component cover. In addition, the exterior surface of the component cover has a low profile, and prevents the conformal EMI shield from physically contacting the covered component. Instead, the exterior surface of the component cover is coated with the EMI shield. This enables the covered component to be removed from the printed circuit board for repair, replacement or salvage without having to risk damage to the printed wiring board or component that may occur with the removal of a conformal EMI shield applied directly to the component.

29 Claims, 14 Drawing Sheets

U.S. PATENT DOCUMENTS

| | | |
|---|---|---|
| 4,124,747 A | 11/1978 | Murer et al. ................. 429/210 |
| 4,197,218 A | 4/1980 | McKaveney ................. 252/503 |
| 4,218,284 A | 8/1980 | Hultman et al. .............. 162/38 |
| 4,474,685 A | 10/1984 | Annis ......................... 252/503 |
| 4,958,736 A | 9/1990 | Urheim ....................... 206/531 |
| 5,164,543 A | 11/1992 | Benson et al. ................. 174/35 |
| 5,399,996 A | 3/1995 | Yates et al. ................... 331/74 |
| 5,428,508 A | 6/1995 | Pronto ......................... 361/818 |
| 5,504,659 A | 4/1996 | Acatay et al. ............... 361/816 |
| 5,684,340 A | 11/1997 | Soler et al. ................... 307/91 |
| 5,689,878 A * | 11/1997 | Dahringer et al. ............. 29/841 |
| 5,696,196 A | 12/1997 | DiLeo ......................... 524/445 |
| 5,918,152 A | 6/1999 | Erzhuang et al. ............ 438/782 |
| 5,968,600 A | 10/1999 | DiLeo ......................... 427/393 |
| 6,046,652 A | 4/2000 | Deiso, III et al. ............. 333/12 |
| 6,074,737 A | 6/2000 | Jordan et al. ............... 428/312 |
| 6,110,563 A * | 8/2000 | Pienimaa et al. ........... 428/137 |
| 6,116,924 A | 9/2000 | Laut ............................. 439/95 |
| 6,155,423 A | 12/2000 | Katzner et al. ............. 206/531 |
| 6,178,097 B1 * | 1/2001 | Hauk, Jr. .................... 361/816 |
| 6,384,324 B2 * | 5/2002 | Flegeo ................. 174/35 GC |

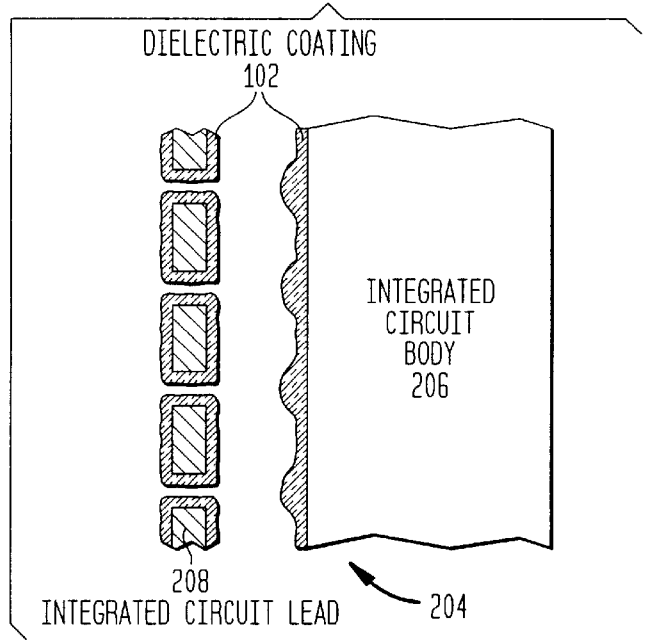
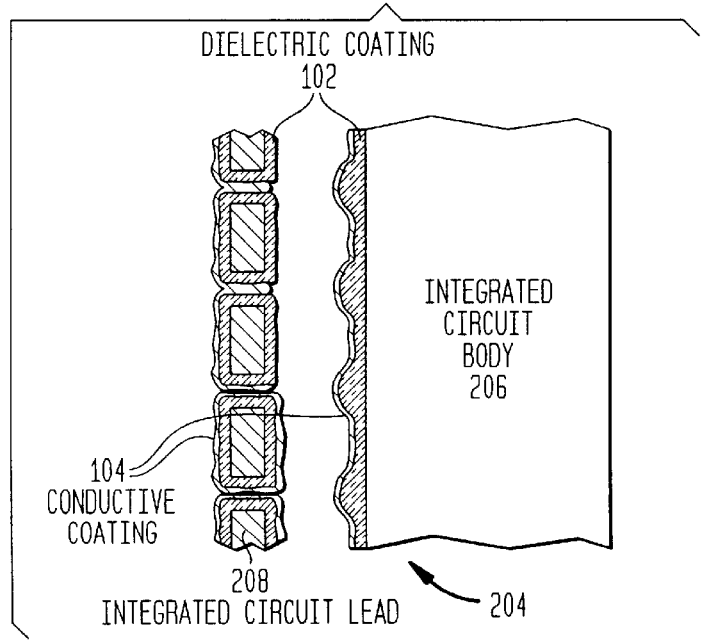

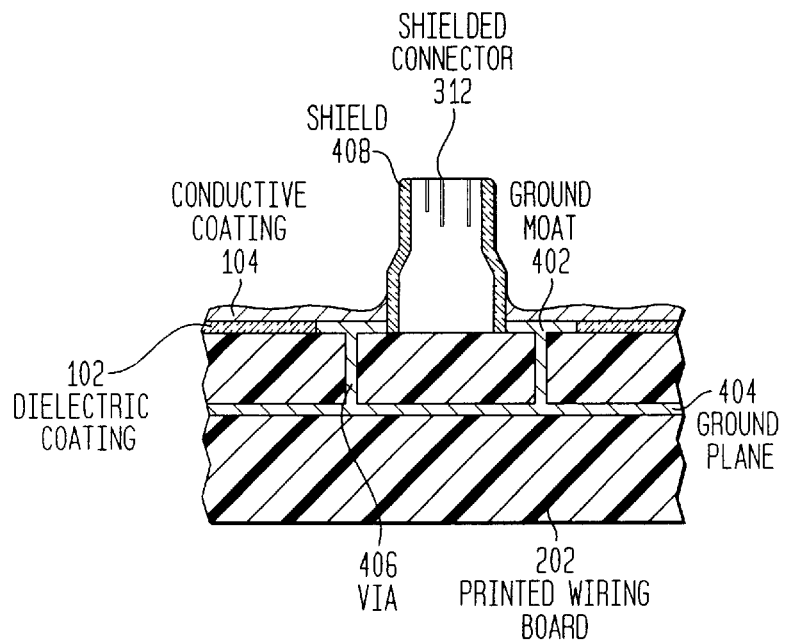
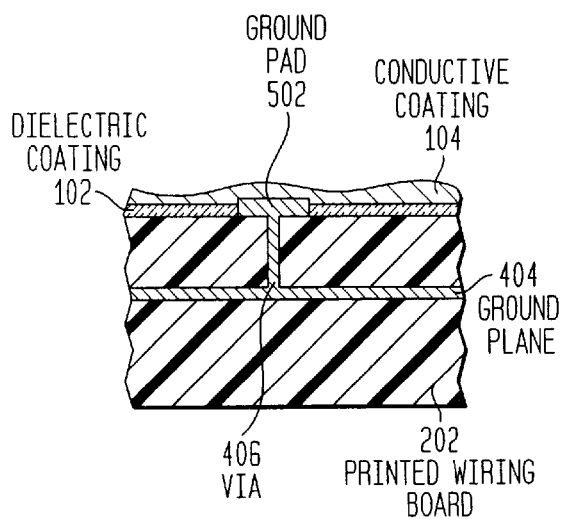

LOW PROFILE NON-ELECTRICALLY-CONDUCTIVE COMPONENT COVER FOR ENCASING CIRCUIT BOARD COMPONENTS TO PREVENT DIRECT CONTACT OF A CONFORMAL EMI SHIELD

RELATED APPLICATIONS

The present application is related to the following commonly owned U.S. Patent Applications:

U.S. Patent Application entitled "A BOARD-LEVEL EMI SHIELD THAT ADHERES TO AND CONFORMS WITH PRINTED CIRCUIT BOARD COMPONENT AND BOARD SURFACES," naming as inventor(s) Samuel M. Babb, Lowell E. Kolb, Brian Davis, Jonathan P. Mankin, Kristina L. Mann, Paul H. Mazurkiewicz and Marvin Wahlen, and filed concurrently herewith Ser. No. 09/812,274; and U.S. Patent Application entitled " FILLER MATERIAL AND PRETREATMENT OF PRINTED CIRCUIT BOARD COMPONENTS TO FACILITATE APPLICATION OF A CONFORMAL EMI SHIELD," naming as inventor(s) Lowell E. Kolb and filed concurrently herewith Ser. No. 09/813,257.

BACKGROUND OF THE INVENTION

1. Field of the Invention

The present invention relates generally to electromagnetic interference (EMI) protective measures and, more particularly, EMI protective measures for printed circuit boards.

2. Related Art

Most countries in the world have regulations that limit the amount of electromagnetic emissions that electromagnetic equipment may produce. Electromagnetic emissions are the unwanted byproduct of high-frequency electronic signals necessary, for example, to operate an electronic microprocessor or other logic circuitry. The electromagnetic interference (EMI) that results is a problem when it interferes with licensed communications, such as television, radio, air communications and navigation, safety and emergency radios, etc. This type of interference has also been known as radio-frequency interference (RFI). See CFR 47 part 15 and ANSI publication C63.4-1992 for regulations in the United States, or CISPR publication 11 or 22 for international regulations. Also, "Noise Reduction Techniques in Electronic Systems" by Henry W. Ott, serves as an excellent reference on the current art for the control of EMI, and the broader topic known as electromagnetic compatibility (EMC).

To meet EMI regulations, most electronic equipment currently employs a combination of two approaches commonly referred to as 'source suppression" and "containment." Source suppression attempts to design components and subsystems such that only essential signals are present in signal interconnections, and that all non-essential radio frequency (RF) energy is either not generated or attenuated before it leaves the component subsystem. Containment attempts to place a barrier around the assembled components, subsystems, interconnections, etc., so that any unwanted electromagnetic energy remains within the boundaries of the product, where it is dissipated harmlessly.

This latter approach, containment, is based on a principle first identified by Michael Faraday (1791–1867), that a perfectly conducting box that completely encloses a source of electromagnetic emissions would prevent those emissions from leaving its boundaries. This principle is employed in conventional shielded cables as well as in shielded enclosures. Conventional shielded enclosures usually consist of a metal box or cabinet that encloses the equipment. The metal box is often supplemented with additional features as necessary in an attempt to keep RF energy from escaping via the power cord and other interconnecting cables. The metal shield may be structural for example, the product enclosure itself. For example, a product enclosure might consist of a plastic structure with a conductive coating on the surface. This approach is commonly implemented in, for example, cell phones. More commonly, the metal shield is implemented as a metal "cage" inside the product enclosure since the EMI suppression required for the entire product or system requires that only a portion of the product be shielded. Such metallic cages are placed around components, or around subsystems when additional EMI reduction is required.

There are numerous drawbacks to the use of such metallic boxes. These drawbacks are primarily related to the lack of shielding effectiveness provided by conventional metallic boxes. For example, the metallic box creates a stagnant buffer of insulating air around the component causing the temperature of the component to increase. In such products, the enclosure typically includes cooling holes and fans to circulate air around the metallic box to dissipate the heat. In addition, electromagnetic energy often escapes the shield at gaps between the shield and the printed circuit board. Electrical gaskets and spring clips have been developed to minimize such leakage. Unfortunately, they increase the cost and complexity of the printed circuit board, and have limited success. In addition, leakage occurs because the cables and wires penetrating the shield are not properly bonded or filtered as they exit the metallic box. Further drawbacks of metallic cages include the added cost and weight to the printed circuit board assembly, as well as the limitations such metallic boxes place on the package design.

SUMMARY OF THE INVENTION

The present invention is directed to a non-electrically-conductive component cover configured to be positioned over a component mounted on a printed wiring board, the component being attached to the printed wiring board such that the component cover and printed wiring board form a component compartment dimensioned to completely encase a desired component. The apparatus and methodologies of the present invention can be used in many applications in which it is desirable to cover a printed circuit board component with a non-conductive, low profile cover that follows closely the contours of the component surface. Embodiments disclosed herein are particularly useful for use with printed circuit board coatings such as the conformal EMI shield disclosed herein. It may be required or desired to gain access to certain components mounted on a printed wiring board for troubleshooting, repair, replacement or salvage. Because coatings applied directly to the printed circuit board substantially coat the component and neighboring printed wiring board surfaces, accessing and removing a component from the printed wiring board requires that the coating be severed at those locations where the component is connected or adjacent to printed wiring board. Conventional techniques are inaccurate and can damage the printed circuit board, the component, and the electrical and physical connection between the two.

A number of aspects of the invention are summarized below, along with different embodiments that may be implemented for each of the summarized aspects. It should be understood that the embodiments are not necessarily inclusive or exclusive of each other and may be combined in any manner that is non-conflicting and otherwise possible. It should also be understood that these summarized aspects of the invention are exemplary only and are considered to be non-limiting. Also, various aspects of the present invention and embodiments thereof provide certain advantages and overcome certain drawbacks of conventional techniques. Not all aspects and embodiments share the same advantages and those that do may not share them under all circumstances. These disclosed aspects, some of which are summarized below, are not to be construed as limiting in any regard; they are provided by way of example only and in no way restrict the scope of the invention.

In one aspect of the invention, a component cover is disclosed. The component cover is non-electrically-conductive and is configured to be positioned over a component mounted on a printed wiring board. The component cover is configured to be attached to the printed wiring board such that the component cover and printed wiring board form a component compartment dimensioned to completely encase the desired component. The component cover has an exterior surface shape suitable to have a coating applied thereto. Preferably, the component compartment has an exterior surface that is contoured and without sharp edges, cavities or other abrupt changes. The resulting component compartment can be airtight and, in certain embodiments, evacuated.

In one preferred embodiment, the component cover is configured such that, when attached to the printed wiring board, the component cover has a minimal profile, not adding significantly to the dimensions of the printed circuit board and its components. In one embodiment, this is achieved with a component cover formed of walls having a minimal thickness and an interior surface that is immediately adjacent to surfaces of the component. In other words, the component cover has a contoured surface that follows generally a contour of the component.

In accordance with certain embodiments, the component cover includes a dome having a closed top, an open bottom, and walls extending between the top and bottom to form a recess suitable for receiving the component. The component cover also includes a flange surrounding the open bottom to be secured to the printed wiring board. The component cover can be unitary or integral.

Embodiments of the component cover of the present invention include different features to facilitate accessing the encased component. In one embodiment, the component cover is configured such that at least a portion of the cover can be severed and separated from the printed wiring board to provide the desired access. In another embodiment, the component cover is formed of a dome connected to a detachable flange. In a further embodiment, the component cover has a removable top, lid or has an aperture with a removable cover or insert. Alternatively, the component cover includes a line of severability that traverses the component cover so as to define a portion of the component cover sufficiently large to provide access. The line of severability can be, for example, a line of weakening such as a crease or fold line that facilitates the severing of a portion of the component cover defined by the line of severability. In still other embodiments, the component cover is sufficiently thin and formed from a material that can be cut manually. In a further embodiment, in combination with the line of severability, a pressure-rupturable dome is implemented so that, in response to a manual force applied radially inward, the dome ruptures and severs along the line of severability.

The component cover dome can have any shape suitable for the component to be covered. For example, the dome can be configured with a surface of revolution about a vertical axis such as a half-sphere, or it can have an arbitrary shape. Similarly, the flange can have any suitable configuration, typically with a planar bottom surface to mate with the printed wiring board.

In another aspect of the invention, a printed circuit board is disclosed. The printed circuit board includes a printed wiring board with one or more components mounted thereon. The printed circuit board also includes one or more of the non-electrically-conductive component covers summarized above.

In a still further aspect of the invention, a method for providing a printed circuit board with one or more components encased in a component compartment suitable to be coated with an atomized coating is disclosed. The method includes (a) determining the dimensions of the component cover dome; (b) determining dimensions of the component cover flange; (c) manufacturing the component cover based on the dome and flange dimensions; and (d) attaching the component cover to the printed wiring board to form the component compartment. Preferably, the last step includes evacuating and sealing the component compartment.

Further features and advantages of the present invention as well as the structure and operation of various embodiments of the present invention are described in detail below with reference to the accompanying drawings. In the drawings, like reference numerals indicate identical or functionally similar elements. Additionally, the left most one or two digits of a reference numeral identify the drawing in which the reference numeral first appears.

BRIEF DESCRIPTION OF THE DRAWINGS

The foregoing and other features and advantages of the present invention will be understood more clearly from the following detailed description and from the accompanying figures. This description is given by way of example only and in no way restricts the scope of the invention. In the figures:

FIG. 2B is a top cross-sectional view of the integrated circuit introduced in FIG. 2A taken along section line I—I, showing only the dielectric coating portion of the conformal EMI shield of the present invention applied to the integrated circuit.

FIG. 2C is a top cross-sectional view of the integrated circuit illustrated in FIG. 2A taken along section line I—I, showing the conductive coating portion of the conformal EMI shield of the present invention applied over the dielectric layer shown in FIG. 2B.

FIG. 4 is a cross-sectional view of a shielded connector such as that shown in FIG. 3 with a ground moat mounted on the printed wiring board that surrounds the connector and is covered by the conformal EMI shield of the present invention.

FIG. 5 is a cross-sectional view of a ground pad mounted on the printed wiring board and covered by the conformal EMI shield of the present invention.

FIGS. 8E-1 and 8E-2 (collectively, FIG. 8E) are cross-sectional views of two embodiments of the component cover shown in FIG. 8A illustrating different embodiments of a line or severability in the form of a crease.

DETAILED DESCRIPTION

Figure 1:
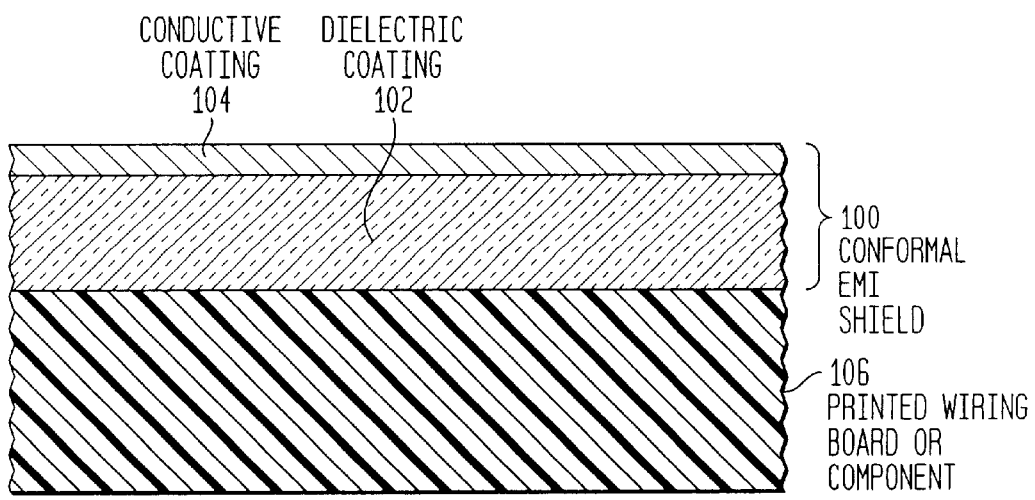
FIG. 1 is a cross-sectional view of one aspect of the conformal EMI shield of the present invention illustrating its conductive and dielectric coatings.

Table of Contents
1. Introduction
2. Conformal EMI Shield Materials
   A. Overview
   B. Dielectric Coating
   C. Conductive Coating
3. A Printed Circuit Board with a Conformal EMI Shield
   A. General
   B. Printed Circuit Board Coverage
   C. Grounding of Conformal EMI Shield
   D. Electrically Connecting EMI Shielded Regions
   E. Design of Printed Wiring Board to Accommodate EMI Shield
4. Individual Components Coated with Conformal EMI Shield
5. A Low Profile Component Cover for Encasing Components
6. Filler Material for Use with Board-Level Containment of Electromagnetic Emissions
7. Manufacturing of Printed Circuit Board with Conformal EMI Shield
8. Closing 1. Introduction The present invention is directed to an electrically continuous conformal EMI protective shield and methods for applying same directly to the surfaces of one or more regions of a printed circuit board. When the EMI shield of the present invention is applied to the surface of a printed circuit board, it adheres to and conforms with the surface of the components and printed wiring board to which it is applied. The conformal EMI shield conformally coats the printed circuit board surfaces while not changing substantially the dimensions of the coated printed circuit board regions. The EMI shield includes low viscosity, high adherence conductive and dielectric coatings each of which can be applied in one or more layers using conventional spray atomization techniques. The shield's conductive coating prevents substantially all electromagnetic emissions generated by the shielded components from emanating beyond the conformal coating. It also prevents electromagnetic emissions generated externally from interfering with the coated printed circuit board regions. The dielectric coating is initially applied to selected locations of the printed circuit board so as to be interposed between the conductive coating and the printed circuit board, preventing the conductive coating from electrically contacting selected portions of the printed circuit board regions.

Aspects of the conformal EMI shield also include a high viscosity, non-electrically-conductive filler material for application to printed circuit board regions that have surfaces that are cavitatious and/or which have sharp edges or other highly variable surface tangent slopes. The filler material and associated methodologies of the present invention are preferably used in conjunction with the noted conformal EMI shield. The high viscosity, electrically non-conductive filler material substantially covers, and preferably infills, each cavity such that the covered cavity is thereafter inaccessible. The filler material also coats the sharp edges on the printed circuit board. Thus, the pretreated portions of the printed circuit board regions have a contiguous, contoured surface that facilitates the coating of the printed circuit board regions with the conformal EMI shield.

In certain aspects of the invention, the invention includes a pre-manufactured non-electrically conductive component cover. This component cover is configured for placement over a printed circuit board component and secured to the printed wiring board. The component cover and printed wiring board surround the component, forming an enclosure referred to as a component compartment. The component cover has a substantially thin cross-section and an interior surface that follows closely the surface of the component, thereby minimizing the volume enclosed by the component cover. In addition, the interior surface of the component cover is immediately adjacent to the component so as not to add significantly to the dimensions of the printed circuit board. As such, the component cover has a low profile and prevents the subsequently applied conformal EMI shield from physically contacting the encased component. Instead, the exterior surface of the component cover is coated with the EMI shield. This provides the significant benefits of the conformal EMI shield while providing access to the compartmentalized component. This enables the covered component to be removed from the printed circuit board for repair, replacement or salvage without having to risk damage to the printed wiring board or component that may occur with the removal of a conformal EMI shield applied directly to the component.

2. Conformal EMI Shield Materials

A. Overview

Figure 2A:
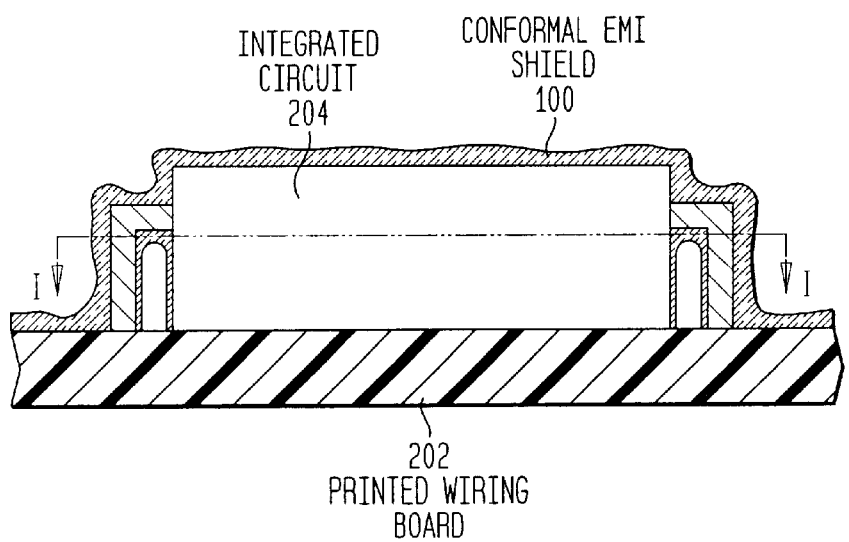
FIG. 2A is a side cross-sectional view of an integrated circuit mounted on a printed wiring board and covered with a conformal EMI shield in accordance with one embodiment of the present invention.

As noted, the conformal EMI shield includes a conductive coating and a dielectric coating permanently bonded to each other. The materials that can be used in the conductive and dielectric coatings are described below with reference to FIGS. 1–3. FIG. 1 is a cross-sectional view of one embodiment of the conformal EMI shield of the present invention. FIG. 2A is a cross-sectional view of an integrated circuit component mounted on a printed wiring board forming a portion of a printed circuit board. The integrated circuit component and printed wiring board have been coated with one embodiment of the conformal EMI shield of the present invention. FIG. 2B is a top view of the integrated circuit component illustrated in FIG. 2A taken along section line I—I illustrating the application of the shield's dielectric coating in accordance with one embodiment of the present invention. FIG. 2C is a top view of the integrated circuit component taken along the same section line illustrating the application of the shield's conductive coating in accordance with one embodiment of the present invention.

Referring now to FIG. 1, this embodiment of EMI shield 100 includes a dielectric coating 102 and a conductive coating 104. The exposed surfaces of selected printed circuit board regions are coated with conformal EMI shield 100. Such surfaces can be, for example, the top, side and, if exposed, bottom surface of a component, the surface of any leads, wires, etc, that are connected to the component, as well as any other exposed surface of any other portions, elements, sections or features (hereinafter "features") of the components and printed wiring board located in the coated printed circuit board region. It should be appreciated that the identification and selection of the proper combination of material properties for both, dielectric coating 102 and conductive coating 104 is important to achieving a conformal EMI shield that can be applied directly to the surface of the printed circuit board without damaging the printed circuit board components and connections, that does not expose the coated regions to risk of electrical shorts and that completely envelops or encases the coated regions to provide a desired shielding effectiveness. As will be described in detail below, conformal EMI shield 100 not only achieves such operational objectives, but does so, as noted, by directly coating; that is, physically adhering to, the surface of coated printed circuit board regions. This enables conformal EMI shield 100 to conformingly coat the surfaces of the shielded printed circuit board regions.

B. Dielectric Coating

Dielectric coating 102 is comprised of a material that is electrically nonconductive and, preferably, thermally conductive. Importantly, the material properties of dielectric coating 102, described in detail below, enable dielectric coating 102 to completely coat and securely attach to the component and board surfaces to which it is applied. Generally, dielectric coating 102 is thixotropic. Specifically, the material properties of dielectric coating 102 include primarily a combination of viscosity and adhesion sufficient to enable dielectric coating 102 to be applied via atomization spray techniques and, once applied, to adhere to the surface in the immediate vicinity of where it was applied. In other words, adhesiveness of dielectric coating 102 is sufficient to prevent dielectric coating 102 from separating from the surface to which it is applied, a phenomenon commonly referred to as dewetting. Such a condition will otherwise result in a void in dielectric coating 102, providing the potential of an electrical short in the exposed portion of printed circuit board 304. Dielectric coating 102 can comprise multiple, successively applied layers of dielectric material. As such, dielectric material 102 preferably also includes the properties necessary to enable it to adhere to or bond with previously applied dielectric layers.

More specifically and in one embodiment, dielectric coating 102 has a viscosity of at least 45" #2 Zahn Cup (full body). In another embodiment, dielectric coating 102 has a viscosity in the range of 50–100" #2 Zahn Cup (full body). In one preferred embodiment, dielectric coating 102 has a viscosity of 70–95" #2 Zahn Cup (full body). A dielectric coating 102 having any of the above viscosity values can be applied uniformly using a conventional spray atomization technique. This enables dielectric coating 102 to completely access and coat the surfaces of the components and board that are located underneath component leads, between components and wiring board surfaces and other regions that are exposed yet difficult to access. Such features of the printed circuit board are referred to generally herein as cavities. In general, dielectric coating 102 can adhere to the materials utilized in the printed circuit board. Such materials include, but are not limited to, FR-4 such as polymethylmethacrylates, bisphenol-A based epoxy and fiberglass, ceramics such as aluminum oxide and silicon dioxide, silicon, polyimide (silicon wafers), polyethylene (sockets), polyethylene terephthalate, polystyrene (sockets), polyphenylsulfone or PPS (chip sockets), polyvinyl chloride or PVC (wire coverings), silicone rubbers such as RTV (various surfaces), aluminum, gold, stainless steel and low carbon steel), tin, lead, and others. Dielectric coating 102 has an adhesion suitable to provide a thixotropic material at the given viscosity. Dielectric coating 102 preferably has an adhesion that enables it to pass the ASTM D-3359-83 Method A Tape Test using a 1" (25 mm wide) semi-transparent pressure-sensitive tape with and adhesion strength of 25–70 and, more preferably, 30–50 ounces per inch when tested in accordance with ASTM Test Method D-3330.

In one embodiment, dielectric coating 102 is comprised primarily of Clear Water Reducible Barrier Coat, Formula Number CQW-L200DF, manufactured by The Egyptian Coating Lacquer Manufacturing Company, Franklin, Tenn., USA. CQW-L200DF has a viscosity in the range of 50–60" #2 Zahn Cup (full body) and an adhesion that enables it to pass the ASTM D-3359-83 Method A Tape Test using a 1" (25 mm wide) semi-transparent pressure-sensitive tape with an adhesion strength of 40±2.5, ounces per inch when tested in accordance with ASTM Test Method D-3330. CQW-L200DF provides excellent adhesion to materials commonly found on a printed circuit board including, but not limited to the materials noted above.

In certain applications there may be surfaces on printed circuit board 304 that are more difficult to adhere to despite dielectric coating 102 having a combination of properties noted above. In particular, cavities and very sharp or pointed surfaces provide less opportunity for a material to adhere to the defining surfaces. In such applications, it is preferred that a conservative approach is taken with regard to coverage since incomplete coverage of the printed circuit board can lead to an electrical short circuit when conductive coating 104 is applied. Accordingly, in such applications, dielectric coating 102 can be applied in multiple applications, each resulting in a layer of dielectric material coating the covered region of the printed circuit board. For example, when dielectric coating 102 is the Egyptian Coating CQW-L200DF, it is preferred that dielectric coating 102 is applied in two applications of approximately 1 mil each, for a total thickness of approximately 2 mils. Each layer is preferably applied with 4 or 5 cross-coats, with a delay or pause between the first and second applications of approximately 1 to 2 minutes to allow the first layer to set up before the second layer is applied. In such embodiments, the initial layer may have a void located at the apex of a sharp edge or within a cavity. Each subsequent cross-coat of dielectric coating 102 adheres to the prior layer as well as the underlying printed circuit board surface, reducing the size of the void. Ultimately, the void is filled or eliminated with a subsequent cross-coat or layer of dielectric material. As is well known in the relevant arts, cross-coats are implemented to insure uniform application of dielectric coating 102 when each layer of dielectric coating 102 is applied manually. However, such cross-coats are not necessary when dielectric coating 102 is applied with robotic or other automated equipment. CQW-L200DF is preferably applied at room temperature, between 60–100 degrees Fahrenheit, and preferably between 60–80 degrees Fahrenheit. Although CQW-L200DF can be cured at room temperature, to expedite manufacturing processes and to remove any water-based components from dielectric coating 102, dielectric coating 102 is preferably thermally cured at an elevated temperature below that which the underlying printed circuit board can withstand. It should be apparent to those of ordinary skill in the art that dielectric coating 102 need only be cured to the extent necessary to apply conductive coating 104. As will be described below, both dielectric coating 102 and conductive coating 104 are thermally cured after conductive coating 104 is applied.

It should be understood that the thickness of dielectric coating 102 can differ from that noted, depending on the application. For example, in an alternative embodiment, dielectric coating 102 is formed with 2 to 4 cross-coats for each of 4 layers of dielectric material, resulting in a thickness of approximately 6 to 10 mils. Thus, dielectric coating 102 has a combination of adhesion and viscosity that enables it to form a uniform, contiguous surface over the coated surfaces with no voids formed therein.

An example of dielectric coating 102 applied to the integrated circuit shown in FIG. 2A is illustrated in FIG. 2B. As shown therein, dielectric coating 102 adheres to the entire exposed surface of integrated circuit leads 208, including those lead surfaces that are adjacent to and facing the side surface of integrated circuit 204. In addition, dielectric coating 102 coats the side surfaces of integrated circuit body 204 that are accessible only through gaps between neighboring leads 208. Note that the thickness of dielectric coating 102 may vary slightly, being greater where access is more direct. Nevertheless, dielectric coating 102 completely coats the entire exposed surface of integrated circuit 204; that is, there are no voids, gaps, breaks or spaces in dielectric coating 102.

C. Conductive Coating

As noted, conductive coating 104 is the outer coating of conformal EMI shield 100, providing the requisite EMI shielding for the coated regions of the printed circuit board. As such, conductive coating 104 is applied to the surface of dielectric coating 102 which has been applied previously to selected regions of the printed circuit board. Due to the complete coverage provided by dielectric coating 102, conductive coating 104 does not contact any portion of the printed circuit board region that has been coated previously by dielectric coating 102. As will be described in detail below, conductive coating 104 will also likely coat and adhere to predetermined portions of printed circuit board, particularly ground pads, strips and moats (collectively, ground lands) on the printed wiring board.

In one preferred embodiment of conformal EMI shield 100, conductive coating 104 is TARA EMI-RFI shielding, Formula MQW-L85 manufactured by The Egyptian Lacquer Manufacturing Company, Franklin, Tenn., USA. MQW-L85 is described in U.S. Pat. Nos. 5,696,196 and 5,968,600 both of which are hereby incorporated by reference herein in their entirety. MQW-L85 is designed for coating product enclosures or housings such as those used in cellular phones.

Generally, conductive coating 104 has the capability to adhere to the surface of dielectric coating 102 and, in certain embodiments, to ground lands in the printed wiring board 202. Conductive coating 104 may also be required to adhere to other predetermined elements on the printed circuit board in some applications. For example, in hybrid shielding arrangements in which conformal EMI shield 100 is used in conjunction with a conventional metallic cage, conformal EMI shield 100 may also be required to adhere to a surface of such a metallic cage.

As with dielectric coating 102, the material properties of conductive coating 104 include primarily a combination of viscosity and adhesion. The combination of properties should be sufficient to enable conductive coating 104 to be applied via atomization spray techniques and, once applied, to adhere to the surface of dielectric coating 102 and, possibly, the other noted elements, in the immediate vicinity of where it was applied. Specifically and in one embodiment, the viscosity of conductive coating 104 can range from 10–40" Zahn cup #3 (fill body). In another embodiment, conductive coating 104 has a viscosity of 15–30" Zahn cup #3 (fill body). MQW-L85 has a viscosity in the range of approximately 15–20" Zahn cup #3 (fill body) in other embodiments.

Conductive coating 104 has an adhesion suitable to enable conductive coating 104 to adhere to the noted materials, in particular, dielectric coating 102. As the viscosity of conductive coating 104 decreases, the adhesiveness may need to increase to provide such a coating. In general, however, conductive coating 104 preferably has an adhesion that satisfies the ASTM 5B rating. To supplement the adhesion of conductive coating 104 to dielectric coating 102, it is preferred that dielectric coating 102 and conductive coating 104 have a similar composite resin structures that facilitate bonding between the two coatings. Such a bonding will be maintained over the life of the printed circuit board due to the two coatings having similar coefficients of thermal expansion. This reduces the shearing stresses between the two coatings as the printed circuit board and, hence, conformal EMI shield 100, heats and cools during the operational life of the printed circuit board. For this reason, when dielectric coating 102 is the noted CQW-L200DF dielectric coating, it is preferred that conductive coating 104 is the noted MQW-L85 due to the similarity of the composite resin structures.

In one embodiment, conductive coating 104 is an aqueous coating composition with particles of conductive metal suspended therein. Such conductive metals can be, for example, copper, silver, nickel, gold or any combination thereof. The ohmic resistance of conductive coating 104 is between 0.05 and 0.2 ohms per square at a film thickness of approximately 1.0 mil. The thickness of conductive coating 104 should be sufficient to prevent the passage of the electromagnetic radiation generated by the coated printed circuit board 304. In one embodiment, the MQW-L85 conductive coating 104 is approximately 1.1±0.2 mils; that is, a thickness in the range of 0.9 to 1.3 mils provides significant shielding effectiveness. However, it should be understood that in alternative embodiments, conducive coating 104 has a thickness that depends on its ohmic resistance and desired shielding effectiveness at the anticipated electromagnetic frequencies to be shielded.

As with the preferred dielectric coating 102 noted above, MQW-L85 is preferably applied at room temperature, between 70–80 degrees Fahrenheit, although an application environment of 60–100 degrees Fahrenheit is suitable. Preferably, multiple cross-coats are applied for one or more layers of conductive coating 104. After application, the MQW-L85 conductive coating 104 is cured at approximately 140–160 degrees Fahrenheit for approximately 30 minutes. It should be understood that lower temperatures can be used, depending on the temperature tolerance of the printed circuit board. The curing time may need to be altered accordingly. However, it is preferred that conductive coating 104 is cured at the noted temperatures because the elevated temperature facilitate the alignment of the metallic flakes. When the metallic flakes orient themselves in this way, the conductivity of the conductive coating 104 is maximized.

A secondary effect of conductive coating 104 is that it is thermally conductive. The heat generated by coated printed circuit board regions are transferred through dielectric coating 102 to conductive coating 104 which conducts through the surface of the board. The heat can then travel off the printed circuit board, primarily by dissipating through convection or through conduction to a heat sink.

Figure 3:
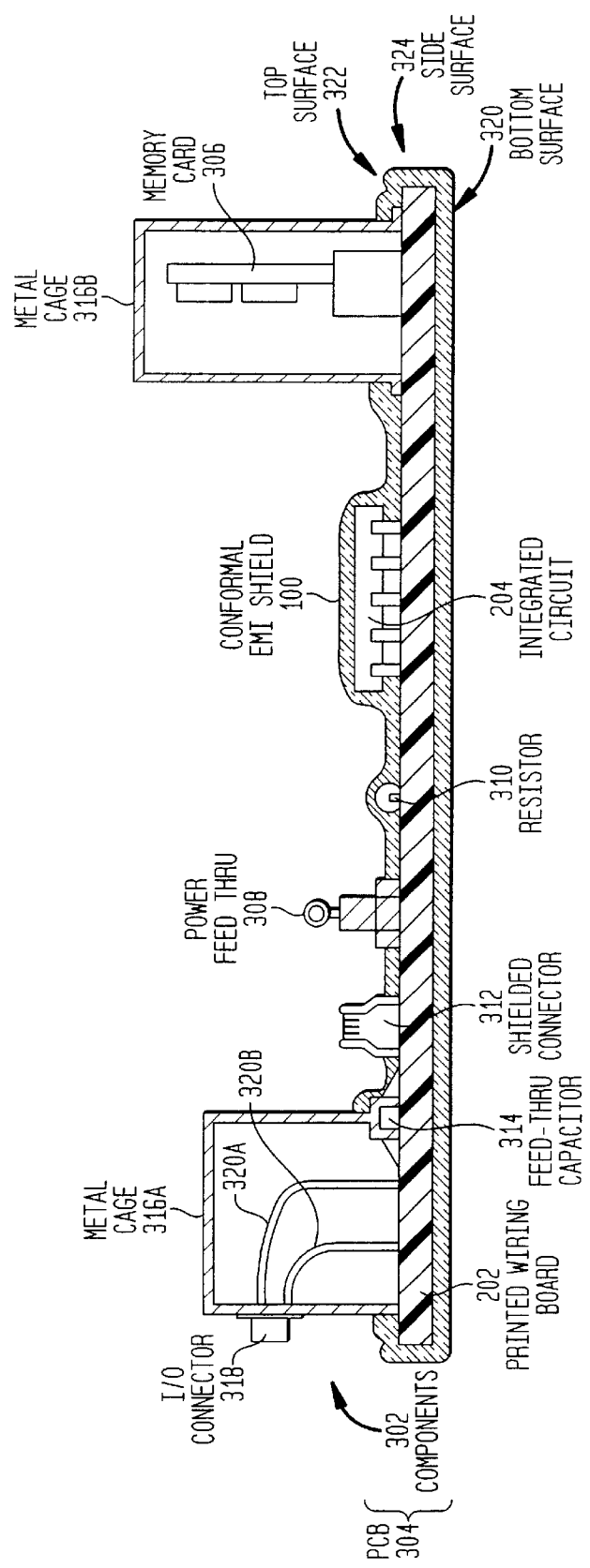
FIG. 3 is a side cross-sectional view of a printed wiring board with various components mounted thereon with one embodiment of the conformal EMI shield illustrated in FIG. 1 applied thereto.

As with dielectric coating 102, conductive coating 104 can be applied to the sharp edges and cavities of printed circuit board 304. This is illustrated in FIG. 2C in which conductive coating 104 covers dielectric coating 102 on integrated circuit 204. Conductive coating 104 coats the side of integrated circuit body 206 behind leads 208, as well as substantially all of the surface of leads 208 themselves. In those circumstances in which the gap between neighboring leads 208 is reduced due to the presence of dielectric coating 102, conductive coating 104 may bridge the gap as shown in FIG. 2C 3. A Printed Circuit Board With A Conformal EMI Shield A. General FIG. 3 is a cross-sectional view of a portion of a printed circuit board 304 with conformal EMI shield 100 of the present invention applied thereto to cover the exposed surfaces of selected portions of printed circuit board 304. Printed circuit board 304 of the present invention comprises, generally, printed wiring board 202 with components 302 mounted thereon, with both shielded at least in part, and preferably completely, with conformal EMI shield 100 of the present invention. In the embodiment illustrated in FIG. 3, conventional metal cages 316A and 316B are utilized to shield connector wires 320A and 320B of I/O connector 318. Conformal EMI shield 100 is applied to desired regions or portions of printed circuit board 304. Such regions or portions include regions of printed wiring board 202 as well as all or part of certain components 302.

Printed circuit board 304 includes a memory card 306 mounted on printed wiring board 202. Memory card 306 is shielded by a conventional metal cage 316B. Printed circuit board 304 also includes integrated circuit 204 introduced above with reference to FIGS. 2A–2C, a resistor 310 and a power feed-through connector 308. Power feed-through connector 310 carries low frequency signals and, therefore, does not need to be shielded. In contrast, another type of connector mounted on printed wiring board 202 is shielded connector 312. Connector 312 receives, for example, high speed data signals. Shielded connector 312 has an EMI shield (described in detail below) whereas power feed-through connector 308 does not.

A metal cage 316A shields I/O cables or leads 320A and 320B of I/O connector 318. I/O connector 318 may be, for example, an RS232 connector, among others. Metal cage 316A includes a surface-mounted feed-through capacitor 314 for preventing signals from being conducted out of metal cage 316A on the low frequency signal traces to which it is connected. Capacitor 314 has a lead in the form of solder spots and is connected to a ground connection.

B. Printed Circuit Board Coverage

In accordance with one preferred embodiment, coated printed circuit board 304 is completely shielded with conformal EMI shield 100. That is, conformal EMI shield 100 is a continuous coating covering all surfaces of printed circuit board 304. However, conformal EMI shield 100 need not cover the entire printed circuit board 304. For example, in one embodiment, there may be regions of printed circuit board for which EMI protection is unnecessary. In other circumstances, such as that shown in FIG. 3, other shielding mechanisms can be implemented on printed circuit board 304 in combination with conformal EMI shield 100 to provide the requisite EMI shielding.

In FIG. 3 metal cages 316 are used to shield I/O connector 318 leads 320 and memory card 306. In addition, ancillary parts of a product which generate minimal or no electromagnetic radiation do not warrant protective measures to be employed to limit such emissions. Such devices include, for example, interconnecting cables, power supplies, disk drives, etc. These and other, similar devices do not need to be coated with the conformal EMI shield of the present invention. As a result, access to such components and subassemblies can be made simpler. Thus, a printed circuit board 304 of the present invention is one that is at least partially coated with one embodiment of conformal EMI shield 100. In FIG. 3, this conformal EMI shield 100 covers a portion of top surface 322 of printed circuit board 304 in which components 302 are mounted, as well as a bottom surface 326 of printed circuit board 304.

As one of ordinary skill in the art would find apparent, different techniques can be implemented to apply conformal EMI shield 100 to specific regions of printed circuit board 304. For example, in one embodiment, conformal EMI shield 100 is selectively applied to the desired portions of a printed wiring board or components mounted thereon using highly directional air spraying techniques. Alternatively, printed circuit board 304 is masked before application of the dielectric coating 102 to avoid application to those regions of printed circuit board 304 that are not to be shielded.

C. Grounding of Conformal EMI Shield

Conductive coating 104 is preferably grounded at various locations on printed circuit board 304. In the following embodiments, conformal EMI shield 100 is connected electrically to a ground plane in printed wiring board 202. Two embodiments of making such a ground connection are illustrated in FIGS. 4 and 5. FIG. 4 is a cross-sectional view of a ground moat surrounding shielded connector 312 illustrated in FIG. 3. FIG. 5 is a cross-sectional view of a ground pad mounted on printed wiring board 202.

Referring now to FIG. 4, conformal EMI shield 100 is preferably grounded through a ground moat at locations where wires, leads, cables, etc., carrying high frequency signals are connected to printed wiring board 202. Conformal EMI shield 100 effectively provides a conductive loop around the signal wire connected to shielded connector 312. A current can be induced in that portion of conductive coating 104 surrounding shielded connector 312 due to the transmission of high frequency signals through the connector. To prevent such a current from traveling to other portions of printed circuit board 304 or to emanate off of the surface of conductive coating 104, ground moat 402 is provided in printed circuit board 304 surrounding signal connector 312. To insure complete shielding, ground moat 402 preferably surrounds completely shielded connector 312. One or more vias 406 connect ground moat 402 to ground plane 404. In the embodiment shown in FIG. 4, the vias 406 are blind vias since they do not pass through to the other side of printed wiring board 202. Preferably, there are a number of vias 406 distributed around ground moat 402 to reduce the distance of the conductive path to ground plane 404. Any signals generated in conductive coating 104 are immediately shunted to ground plane 404 through ground moat 402 and a via 406.

Note that dielectric coating 102 is applied to printed wiring board so as to not cover the surface of ground moat 402 and shielded connector 312. In one embodiment, this is achieved by masking ground moat 402 and shielded connector 312 prior to applying dielectric coating 102. Conductive coating 104 is applied so as to coat dielectric coating 102 as well as ground moat 402. This is achieved by removing the mask from ground moat 402 and masking shielded connector 312 prior to applying conductive coating 104. Importantly, either ground moat 402 and/or conductive coating 104 are electrically connected to shield 408 of shielded connector 312. Thus, any interference generated along the length of the signal lead, connector or conductive coating 104 is immediately shunted to ground.

Thus, a ground moat 402 mounted on printed wiring board 202 completely around shielded connector 320 and connected electrically to a shield 408 of connector 312 and a ground plane 404 eliminates the EMI that can be transmitted by conductive coating 104 in the vicinity of shielded connector 312.

FIG. 5 is a cross-sectional view of a ground pad 502 mounted on printed wiring board 202. In one embodiment, conformal EMI shield 100 is grounded periodically through such ground pads 502 across all regions of conformal EMI shield 100. In certain applications, the performance of conformal EMI shield 100 is improved when it is grounded periodically. In one embodiment, this is achieved by providing one or more ground pads 502 across the shielded regions of printed circuit board 304. One such ground pad 502 is illustrated in FIG. 5, although there are many other embodiments which can be implemented.

Ground pad 502 is a surface mounted conductive pad connected to ground plane 404 through blind via 406. As with the embodiment illustrated in FIG. 4, dielectric coating 102 is applied to printed wiring board 202 so as to coat the surface of printed wiring board 202 and not ground pad 502. Conductive coating 104 is applied so as to coat dielectric coating 102 and ground pad 502. This connects electrically conductive coating 104 to ground plane 404.

In an alternative embodiment, vias 406 transect the entire printed wiring board 202; that is, they extend from ground plane 404 to both surfaces of printed wiring board 202. Accordingly, one embodiment of printed circuit board 304 is preferably arranged to take advantage of such ground vias. For example, shielded connectors 312 and corresponding ground moats 402 can be mounted on opposing sides of printed wiring board 202. Alternatively, ground pads 502 or a combination of ground moats 402, ground pads 502, ground strips or other combinations of ground lands can be disposed on opposing sides of printed wiring board 202.

It should be understood that the location, quantity and distribution of ground lands in general, and ground moats 402 and ground pads 502 specifically, can vary significantly depending on a number of well-known factors and features of printed circuit board 304. For example, the quantity of signal leads that come onto or off of printed wiring board 202, the frequency of the signals traveling on the signal leads. In addition, the resulting electromagnetic fields that are generated by the signals, which is based on the type of lead and connector as well as the signal characteristics will also determine the grounding scheme implemented. Referring to FIG. 3, for example, ground moat 402 may be located at various locations on printed circuit board 304, depending on the type of signals and components implemented. For example, ground moat 402 can be mounted on bottom surface 326 of printed wiring board 202 around the location at which I/O leads 320 enter printed wiring board 202.

D. Electrically Connecting EMI Shielded Regions

As noted, conformal EMI shield 100 can be applied to predetermined regions or portions of printed circuit board 304. Referring to the exemplary embodiment illustrated in FIG. 3, conformal EMI shield 100 coats top surface 322 of printed circuit board 304. This coating is physically contiguous, surrounding such elements as metal cages 316, shielded connector 312 and power feed-through connector 308. Similarly, in the embodiment disclosed in FIG. 3, conformal EMI shield 100 also coats entirely bottom surface 326 of printed wiring board 202.

A potential can develop between the region(s) of conformal EMI shield 100 that coat top surface 322 and the region(s) of conformal EMI shield 100 that coat bottom surface 326. Should such a potential develop, the two regions of conformal EMI shield 100 can effectively form an RF antenna and, therefore, be a source of EMI. To prevent this from occurring, the top and bottom surface regions of conformal EMI shield 100 are preferably connected electrically to each other, directly or through a common ground. Thus, conformal EMI shield 100 is an electrically continuous coating that may or may not be physically contiguous over the surfaces of printed circuit board 304.

Figure 6A:
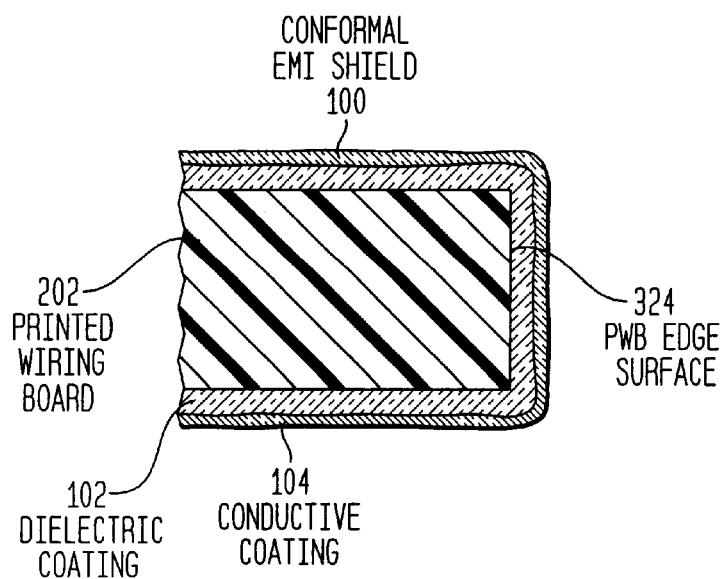
FIG. 6A is a cross-sectional view of an edge region of a printed wiring board showing a continuous conformal EMI shield of the present invention coating the top, edge and bottom surfaces of the printed wiring board.

In the embodiment illustrated in FIG. 6A, the two regions of conformal EMI shield 100 that coat the top and bottom surfaces of printed circuit board 202 are connected to each other through another region of conformal EMI shield 100 applied to edge surfaces 324 of printed wiring board 202. In other words, the three regions (top, edge and bottom coatings) can be considered a single region and printed circuit board 304 is coated continuously on the top, edges and bottom surfaces with conformal EMI shield 100. Thus, conformal EMI shield 100 is, in this embodiment, physically contiguous and electrically continuous.

Figure 6B:
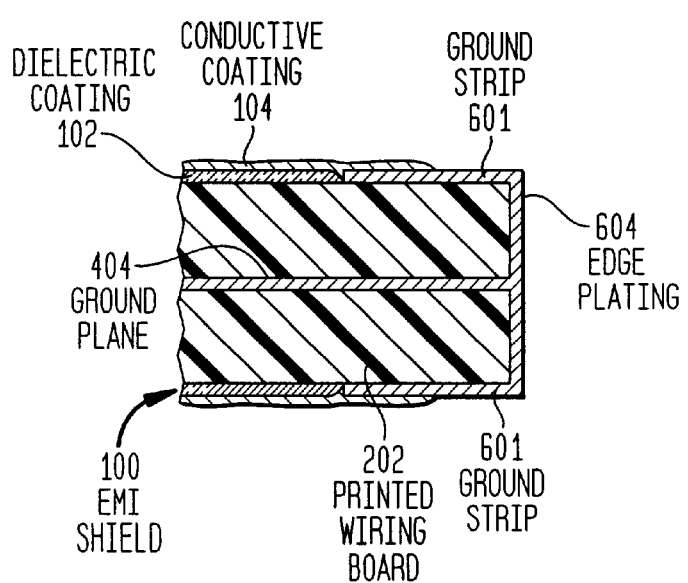
FIG. 6B is a cross-sectional view of an edge region of a printed wiring board showing the conformal EMI shield coating ground strips mounted on the top and bottom surface proximate to the edge surfaces on which a grounded edge plating is mounted.

Should it be impracticable or otherwise undesirable to apply conformal EMI shield 100 to edges 324 of board 202, then alternative arrangements can be implemented to provide electrical continuity between all regions of conformal EMI shield 100. For example, in an alternative embodiment shown in FIG. 6B, printed wiring board 202 can be made with plated edges. Edges 324 of board 202 are preferably plated with the same material as the material utilized in ground plane 404, such as copper. The top and bottom regions of conformal EMI shield 100 are connected to edge plating 604 on each side of board 202. As shown in FIG. 6B, edge plating 604 wraps around printed wiring board 202 to form ground strips 601 which cover some distance or area on top and bottom surfaces 322, 326 thereof. As used herein, a ground strip 601 is an elongate ground pad.

Ground strips 601, edge plating 604 and ground plane 404 are connected physically and electrically. Dielectric coating 102 is applied to printed wiring board 202 so as to coat top and bottom surfaces 322, 326 of printed wiring board 202 and not ground strips 601. Conductive coating 104 is applied so as to coat dielectric coating 102 and at least a portion of ground strips 601, as shown in FIG. 6B. This provides an electrical connection between conductive coating 104 on the top and bottom surfaces 322, 326 to each other as well as to ground. Thus, in this alternative embodiment, conformal EMI shield 100 includes physically separate regions that are connected electrically through edge plating 604.

Figure 6C:
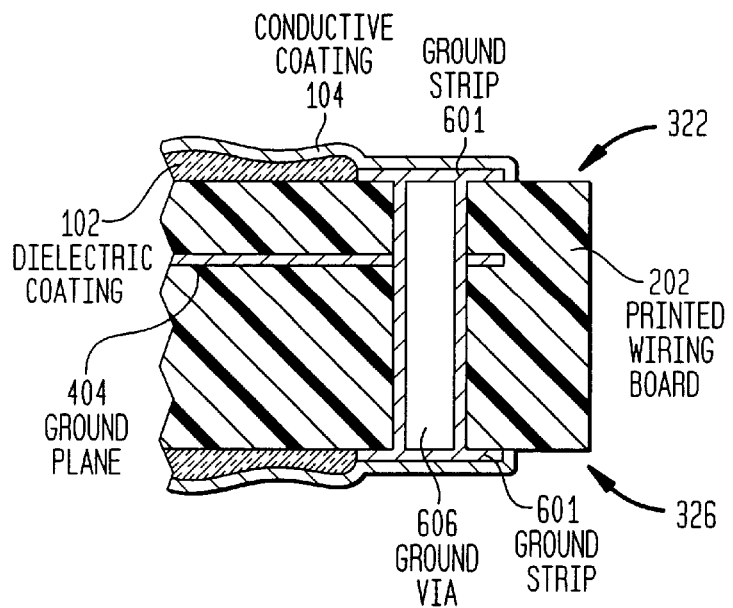
FIG. 6C is a cross-sectional view of an edge region of a printed wiring board showing the conformal EMI shield coating ground strips mounted on the top and bottom surface proximate to the edge surfaces with the ground strips connected to a ground plane through ground vias.

FIG. 6C is a cross-sectional view of an alternative approach to achieving electrical continuity between regions of conformal EMI shield 100. In this alternative embodiment, printed wiring board 202 is manufactured with rows of ground vias 606 and one or more ground strips 601 around its periphery. As noted, a ground strip 601 is an elongate ground pad. On each side 322, 326 of printed wiring board 202, the vias 606 are connected electrically to ground strips 601. As in the embodiment illustrated in FIG. 6B, dielectric coating 102 is applied to printed wiring board 202 so as to coat top and bottom surfaces 322, 326 of printed wiring board 202 while not coating ground strips 601. Conductive coating 104 is applied so as to coat dielectric coating 102 and at least a portion of ground strips 601. This connects electrically conductive coating 104 on the top and bottom surfaces 322, 326 to each other as well as to ground.

Figure 6D:
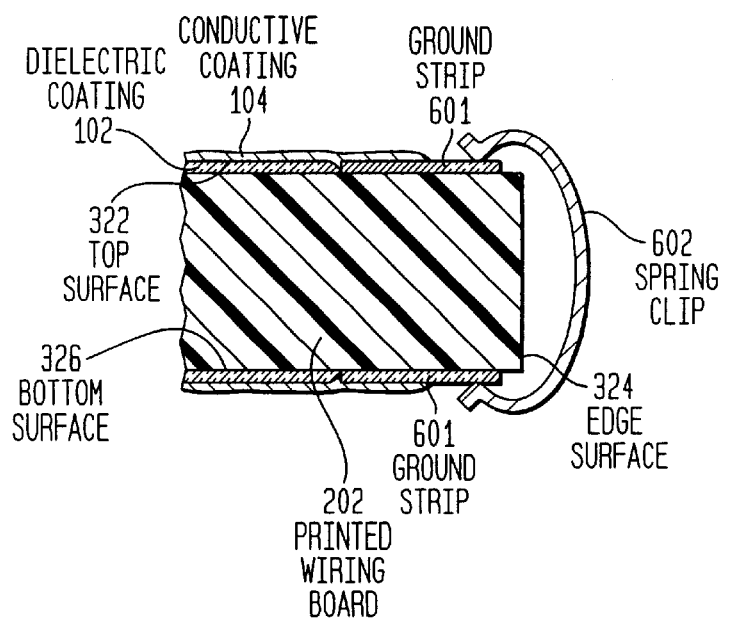
FIG. 6D is a cross-sectional view of an edge region of a printed wiring board showing the conformal EMI shield coating ground strips mounted on the top and bottom surface proximate to the edge surfaces with a spring clip electrically connecting the two ground moats.
Figure 6E:
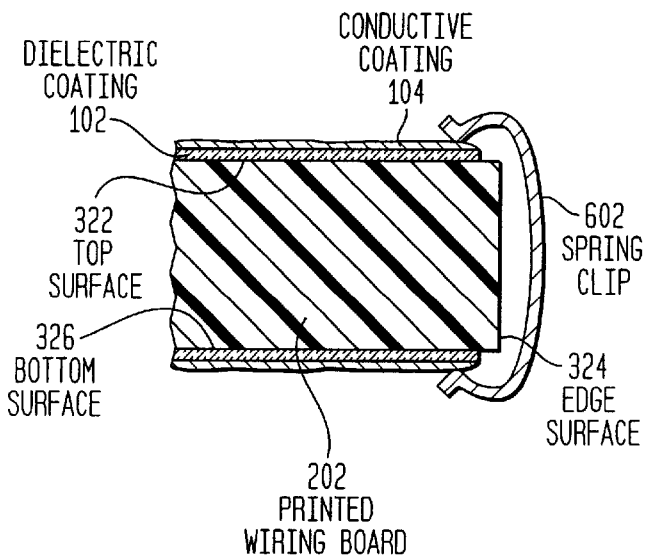
FIG. 6E is a cross-sectional view of an edge region of a printed wiring board showing the conformal EMI shield coating the top and bottom surfaces with a spring clip electrically connecting the two conformal EMI shield regions.

FIGS. 6D and 6E are cross-sectional views of an edge region of printed wiring board 202 showing different embodiments for connecting electrically regions of conformal EMI shield 100 that coat the top and bottom surfaces 322, 326 of printed wiring board 202 using spring clips. Specifically, in FIG. 6D ground strips 601 are mounted on top and bottom surfaces 322, 326 of printed wiring board 202 proximate to edge surfaces 324. One or more spring clips 602 are secured around edge 324 of printed wiring board 202 so as to contact ground strips 601 secured to opposing sides of printed wiring board 202. Sprint clip 602 is formed from an electrically conductive material, and is preferably a unitary device that can be installed manually. As with the other embodiments, dielectric coating 102 is applied to printed wiring board 202 so as to coat top and bottom surfaces 322, 326 of printed wiring board 202 while not coating ground strips 601. Conductive coating 104 is applied so as to coat dielectric coating 102 and at least a portion of ground strips 601. This connects electrically conductive coating 104 on the top and bottom surfaces 322, 326 to each other through spring clip 602. It should become apparent that each ground strips 601 has a size or length sufficient to enable spring clip 602 to attach securely thereto, without risk of inadvertent detachment.

In the embodiment illustrated in FIG. 6E, conformal EMI shield 100 coats the entire top and bottom surfaces 322, 326 in the vicinity proximate to edge surface 324. In such embodiments, ground strips 601 shown in FIG. 6D are eliminated, with spring clip 602 contacting directly conductive coating 104. As one of ordinary skill in the art would find apparent, other configurations may be implemented to connect electrically regions of conformal EMI shield 100 coating top and bottom surfaces 322, 326 of printed circuit board 304.

E. Design of Printed Wiring Board to Accommodate EMI Shield

Aspects of the present invention include a printed wiring board 202 constructed and arranged to operate with conformal EMI shield 100, as well as a printed circuit board 304 incorporating such a printed wiring board 202 and conformal EMI shield 100.

Printed wiring board 202 typically includes multiple layers each of which includes an insulator, commonly an epoxy glass, with signal traces and a ground plane formed on opposing surfaces thereon. Typically, traces internal to printed wiring board 202 are located between two ground planes with an intervening layer of insulating material. Signal traces that travel long the surface of the printed wiring board are positioned between a ground plane below, with an intervening layer of insulating material, and air above.

The characteristic impedance of the signal traces is a function of the width and thickness of the trace, the distance between the trace and surrounding ground plane(s), and the dielectric properties of the intervening insulating material. The characteristic impedance in turn effects the electrical properties of the traces such as the velocity of propagation.

The greatest contributor to the characteristic impedance of a signal trace is the parasitic capacitance established between the signal trace and its neighboring traces. Since internal traces have a ground plane located above and below it while a surface trace has a single ground plane located below it, the parasitic capacitance of the internal trace is approximately twice that of surface traces, with a concomitant reduction in characteristic impedance.

This is not the case for printed circuit boards of the present invention. Coating a printed wiring board 202 with conformal EMI shield 100 will increase significantly the parasitic capacitance of the surface traces, decreasing the characteristic impedance of the surface traces. The change in the characteristic impedance is, as noted, a function of the cross-section of the surface trace, the distance between the surface trace and conductive coating 104 and the dielectric properties of dielectric coating 102.

Thus, in accordance with aspects of the present invention, printed wiring board 202 and conformal EMI shield 100 are configured to control electrical characteristics of surface traces by adjusting such features. For example, the width and thickness of the surface traces as well as the dielectric constant and thickness of dielectric coating 104 can be adjusted to achieve desired electrical characteristics such as characteristic impedance. In an alternative embodiment, printed circuit board 102 can be configured with no traces on the outer board layers.

In addition, a printed wiring board 202 of the present invention includes ground moats 402 mounted around connectors that may carry high frequency signals, as described above, and, preferably, ground lands mounted periodically throughout printed wiring board 202.

4. Individual Components Coated With Conformal EMI Shield

Repair of printed circuit boards 304 coated with conformal EMI shield 100 is likely to be difficult and expensive. The ideal solution would be to coat mainly the inexpensive parts of printed circuit board 304, such that it would be economical to merely discard failed or defective boards, salvaging the expensive processors, etc. for reuse. However, such components would lack the appropriate shielding. Aspects of the present invention provide a technique for coating such components with conformal EMI shield 100 while enabling the components or subassemblies to be removable for repair, replacement or salvage.

Figure 7:
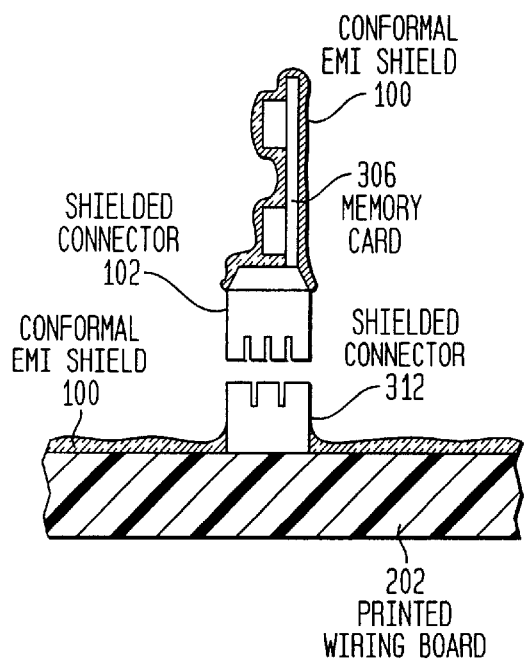
FIG. 7 is a custom memory card coated with the conformal EMI shield in accordance with one embodiment of the present invention.

FIG. 7 is a cross-sectional view of an exemplary embodiment of a removable component, memory card 306, coated with conformal EMI shield 100. In this exemplary embodiment, a workstation or desk top computer provides the capability to be configured more or less memory as needed for the computer's particular application. To accomplish this, a printed circuit board with memory sockets to receive various combinations of memory cards is included in the device. Such memory cards can be plugged into the socket and shielded with conformal EMI shield 100 with the other components 302 on printed circuit board 304. Alternatively, such a memory card can be shielded with a conventional metal cage 316. As shown in FIG. 3, when such a conventional metal cage is utilized, the cage is connected to conformal EMI shield 100 through, for example, gaskets or flanges that are bonded to conformal EMI shield 100.

In accordance with another aspect of the invention, memory card 306 can be coated individually; that is, conformal EMI shield 100 can be applied to memory card 306 prior to it being installed in printed circuit board 304. Embodiments of such aspects of the invention include a mechanism to electrically connect conformal EMI shield 100 coating memory card 306 with conformal EMI shield 100 coating printed wiring board 202. In the embodiments shown in FIG. 7, such an electrical connection is achieved through the use of mating shielded connectors 702 and 312. As shown, connector 312 is physically and electrically connected to conformal EMI shield 100 applied to printed wiring board 202.

Most computers need to accommodate accessory cards from various vendors that add special capabilities. Examples include cards that provide the interface to a particular LAN protocol, or a high-speed data interface. In one embodiment, the devices have special features to interface with conformal EMI shield 100. In a more preferred embodiment, the devices are individually coated with conformal EMI shield 100, as described above. In further embodiments, a local shielding enclosure 316 such as a metal enclosure with appropriate removable covers for installation of the accessory cards can be used. The interface between the shielding of the metal enclosure and the coated board would be as described above in connection with hybrid shielding arrangements, such as gaskets between the enclosure and ground strips 603 on printed wiring board 202.

5. A Low Profile Component Cover for Encasing Components

It may be required or desired to access certain components 302 mounted on printed wiring board 202. For example, during the operational life of printed circuit board 304, it may be desired to access a component 302 for troubleshooting, repair or replacement. Also, it may be desired to salvage a component 302 at the end of the operational life of printed circuit board 304. Such components 302 may include, for example, expensive or rare components.

As noted, conformal EMI shield 100 completely coats those surfaces to which it is applied. Removal from printed wiring board 202 of a component 302 coated with conformal EMI shield 100 requires that shield 100 be severed at those locations where the component is connected or adjacent to printed wiring board 202. For example, referring to FIG. 2C, this may include the boundaries between printed wiring board 202 and integrated circuit body 206 and leads 208.

There are a number of currently available techniques that could be used to sever conformal EMI shield 100. One such conventional approach is to chemically etch or otherwise dissolve conformal EMI shield 100. Unfortunately, such treatments typically include the use of chemicals that are sufficiently active not only to penetrate conformal EMI shield 100, but to also damage the coated components 302. In addition, the accuracy of the application is limited, making it difficult to precisely apply the chemicals to remove specific areas of conformal EMI shield 100. As a result, severing conformal EMI shield 100 at component-board boundaries around, for example, component leads, would be inefficient.

Another conventional technique that could be used to sever conformal EMI shield 100 is referred to as sandblasting or, more particularly, as bead blasting. However, such an approach also lacks precision and risks damage to the coated component 302, particularly fragile components. Furthermore, even if components 302 can be successfully removed from printed wiring board 202, all surfaces of component 302 including its body and leads, will be coated with conformal EMI shield 100, as noted above. This may interfere with the intended activities or future use of the component.

There are two options currently available to avoid such drawbacks of traditional approaches. One approach is to not coat fragile and expensive components 302 with conformal EMI shield 100, in which case the component would not be shielded. An alternative approach is to contain the component 302 within a conventional metallic cage 316, in which case it will suffer from the drawbacks noted above. Aspects of the present invention described below overcome the above and other drawbacks of chemical etching and bead blasting while not preventing the use and attendant benefits of conformal EMI shield 100.

In one aspect of the invention, a pre-manufactured, non-electrically-conductive, low profile component cover is secured to printed wiring board 202, forming a sealed compartment dimensioned to encase component 302. Conformal EMI shield 100 can then be applied to the exterior surface of the component cover in the manner described above. Since the component cover has a low profile, the covered component 302 experiences the same benefits of conformal EMI shield 100 as if covered directly with conformal EMI shield 100. Here, however, conformal EMI shield 100 will not interfere with future uses of the covered component. At least a portion of the cover, along with conformal EMI shield 100 attached thereto, can be easily removed from printed circuit board 304 to expose component 302. Component 302 is thereafter accessible, and can be tested or removed from printed wiring board 202 using conventional techniques. In sum, components enclosed in a component compartment of this aspect of the invention are accessible while enjoying the many advantages of conformal EMI shield 100.

Figure 8A:
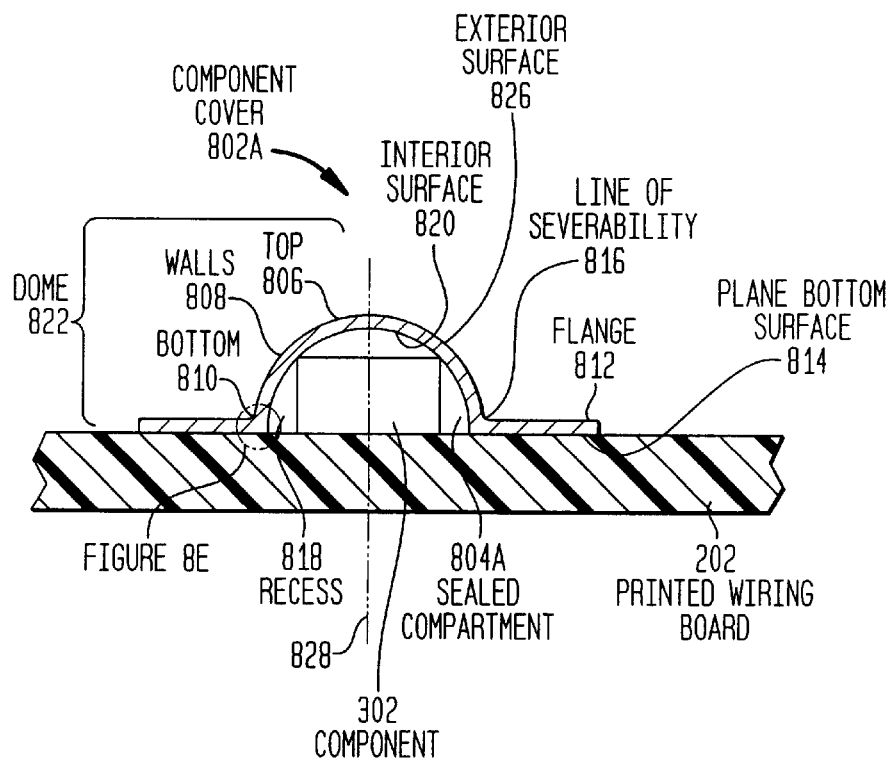
FIG. 8A is a cross-sectional view of a printed wiring board with a component mounted thereon with a nonconductive component cover mounted over the component to encase the component in a compartment defined by the cover and the printed wiring board.

FIG. 8A is a cross-sectional view of one embodiment of a component 302 disposed in a sealed component compartment 804A formed by placing a non-electrically-conductive, low profile component cover 802A over component 302, and securing component cover 802A to printed wiring board 202. Component cover 802A in FIG. 8A has a surface of rotation about a vertical axis 828, defining, in this embodiment, a symmetrical half-sphere. In an alternative embodiment shown in FIGS. 8B–8D a more arbitrarily shaped component cover 802B is shown. There, component cover 802B forms with printed wiring board 202 an arbitrarily-shaped component compartment 804B for a processor integrated circuit 850.

In the embodiment illustrated in FIG. 8A, nonconductive component cover 802A is preferably a pre-manufactured cover with a dome 822 configured to envelop a selected component 302, and a flange 812 configured to be secured to printed wiring board 202. Dome 822 has a closed top 806, an open bottom 810 remote from top 806, and walls 808 extending between closed top 806 and open bottom 810, forming a recess 818 suitable for receiving component 302. Flange 812 surrounds open bottom of dome 822 and has a generally planar bottom surface 814 to mate with printed wiring board 202. When attached to printed wiring board 202, component cover 802A and printed wiring board 202 form component compartment 804A. Component cover 802A can be unitary, or dome 822 and flange 812 are separately manufactured pieces that are attached to each other to firm an integral cover. Dome 822 and flange 812 can be detachably or permanently connected using an appropriate non-electrically-conductive adhesive.

Component cover 802A is sealed to printed wiring board 202. Preferably, the junction between component cover 802A and printed wiring board 202 are sealed so as to prevent dielectric coating 102 from penetrating component compartment 804A. Preferably, component compartment 804A is evacuated and sealed to remove moisture from compartment 804A and prevent corrosion of component 302. Any commonly known technique can be used to create a vacuum in compartment 804A. For example, the same technique as that commonly used to mount an integrated circuit can on a printed wiring board can be used.

As noted, one important feature of component cover 802A is that it not prevent access to covered component 302. In one embodiment, component cover 802A is sufficiently thin and formed from a material that can be cut manually. In an alternative embodiment illustrated in FIG. 8A, a line of severability 816 traverses component cover 802A at the boundary between dome 822 and flange 812. Preferably, line of severability 816 is a line of weakening that facilitates the severing of dome 822 from flange 812, leaving flange 812 secured to printed wiring board 202. In one embodiment, line of severability 812 is a crease, fold line or other weakened form. FIG. 8E shows two embodiments of a crease line 824. In FIG. 8E-1, crease 824A is v-shaped groove pointing towards the interior corner formed by flange 812 and wall 808. In FIG. 8E-2, crease 824B is directed laterally across wall 808. Such embodiments substantially reduce the thickness of component cover 802A at that location, facilitating severing of the portion of the cover traversed by the line of severability, here, dome 822. Such severing may be achieved by scoring conformal EMI shield 100 (not shown) and cover 802A. In certain embodiments, the material, wall thickness and depth of crease 824 may be sufficient to enable a technician to score conformal EMI shield 100 and sever dome 822 manually.

It should be understood that the location and type of line of severability 816 can be selected for a given application. For example, the noted embodiments of line of severability 816 do not provide an opening into compartment 804A. Such embodiments enable compartment 804A to be evacuated, as noted above. However, should component 302 not be subject to corrosion or otherwise benefit from such an evacuation, then line of severability 816 could be implemented as a line of perforations or other embodiment which partially penetrates the walls 808 of dome 822.

Returning to FIG. 8A, in an alternative embodiment, dome 822 of component cover 802A is pressure-rupturable. When walls 808 are subjected to a manual force applied radially inward, dome 822 ruptures and is severed along line of severability 816. In such embodiments, the interior surface 820 of dome 822 would not touch the component 302 as shown in FIG. 8A; rather, a space sufficient to enable the ruptured dome 822 to separate from flange 812 would be provided. Thus, in such an embodiment, to expose component 302, conformal EMI shield 100 is cut at the junction between dome 822 and flange 812. In those embodiments in which line of severability is a crease, the crease can guide the point of a knife or other cutting instrument. Manual force is then applied to walls 808 adjacent to flange 812, severing dome 822 from flange 812. Dome 822 is thereafter removed to expose component 302.

Preferably, recess 818 is dimensioned to receive component 302 with minimal space between the interior surface 820 of dome 822 and component 302 when component cover 802A is secured to printed wiring board 202. This, in conjunction with the relatively thin top 806, walls 808 and flange 812, results in a component compartment 804A having a minimal profile. In other words, the volume of compartment 804A in not substantially greater than the volume defined by the surfaces of component 302.

An important feature of component cover 802A is that it have a shape suitable for receiving dielectric coating 102 and, ultimately, conductive coating 104, while providing this minimal profile. As such, the exterior surface 826 of component cover 802A is preferably without sharp edges, indentations, or other abrupt changes. Thus, dome 822 can take on virtually any shape beyond the symmetrical half-sphere shape illustrated in FIG. 8A. For example, dome 822 can be disk-shaped, elliptical, rectangular and the like.

Figure 8B:
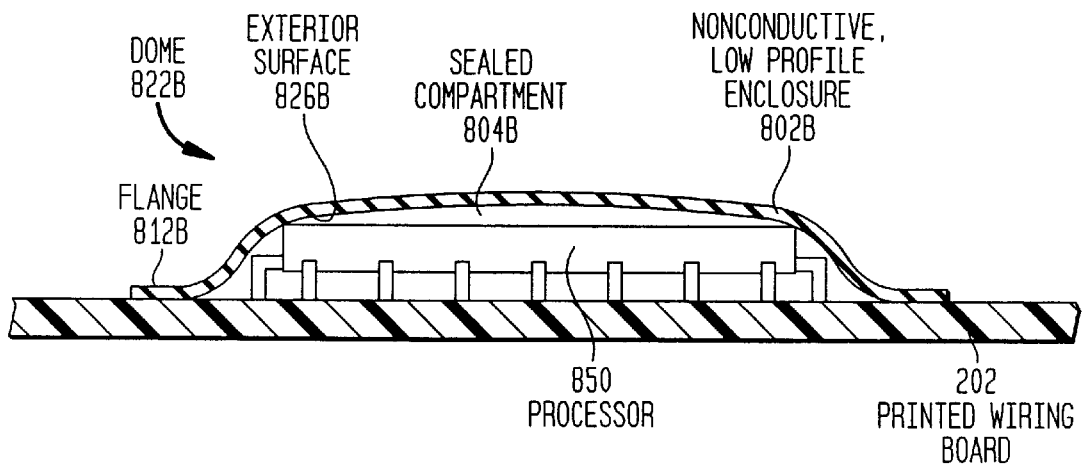
FIG. 8B is a cross-sectional view of a printed wiring board with a processor mounted thereon with a nonconductive, conformal cover with a contoured, arbitrary shape mounted over the processor to encase the processor in a compartment defined by the cover and the printed wiring board.
Figure 8C:
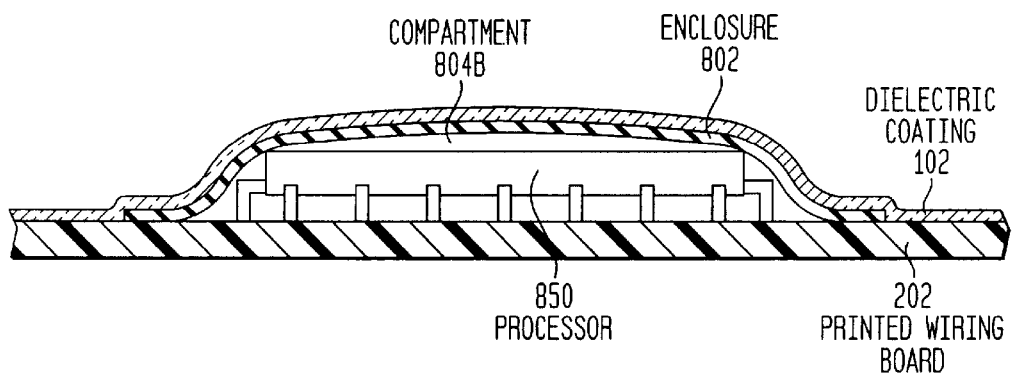
FIG. 8C is a cross-sectional view of the printed wiring board and component compartment shown in FIG. 8B with a dielectric coating of the present invention covering the surface of the component cover and surrounding printed wiring board.
Figure 8D:
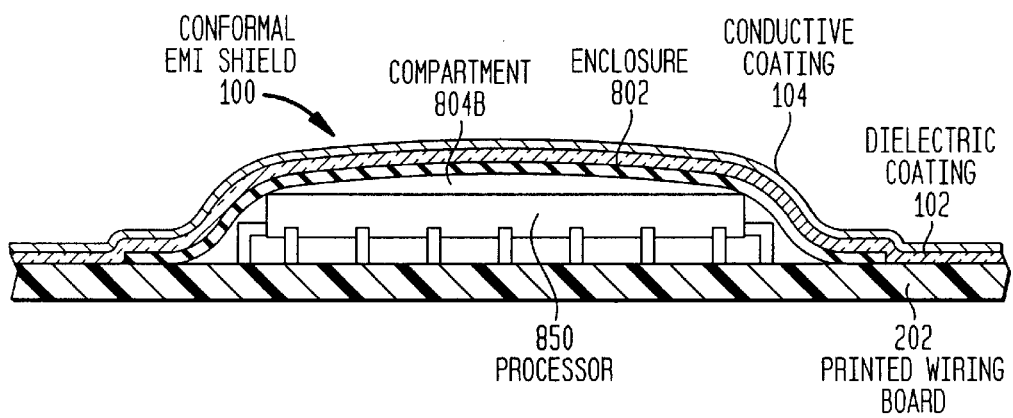
FIG. 8D is a cross-sectional view of the printed wiring board and component compartment shown in FIG. 8C with a conductive coating of the present invention covering the dielectric coating, forming conformal EMI shield of the present invention.
Figures 1, 8E:
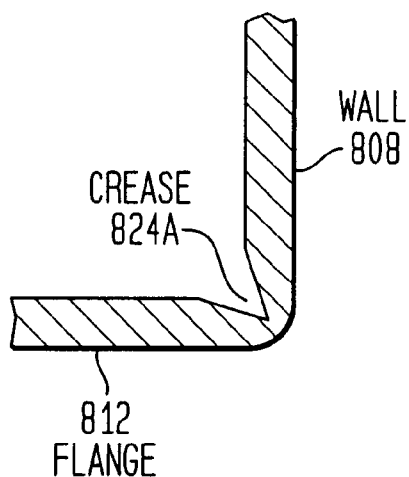
Figures 2, 8E:
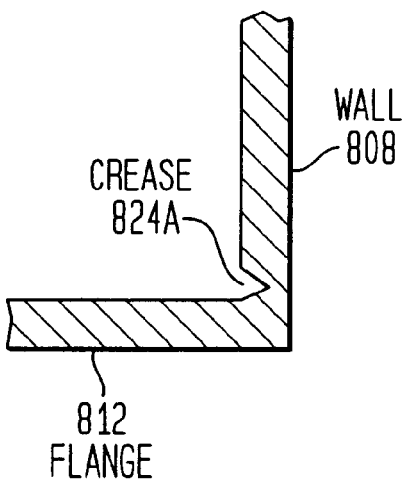

In another embodiment illustrated in FIGS. 8B–8D, a component cover 802B has a contoured, arbitrary shape. FIG. 8B is a cross-sectional view of component cover 802B dimensioned to cover a processor IC 850. FIG. 8C is a cross-sectional view of component cover 802B with a dielectric coating 102 covering the exterior surface thereof, while FIG. 8D is a same view showing a conductive coating 104 covering dielectric coating 102 forming conformal EMI shield 100 of the present invention.

Referring to FIG. 8B, there is no distinctive boundary between dome 822B and flange 812B due to the contoured shape. A line of severability (not shown) can be formed in component cover 802B at any location above where flange 812B is attached to printed wiring board 202.

Referring to FIG. 8C, dielectric coating 102 is applied to the surface of printed wiring board 202 and exterior surface 826B of nonconductive conformal cover 802B. Similarly, as shown in FIG. 8D, conductive coating 104 is applied so as to cover entirely dielectric coating 104 applied previously to cover 802B.

Component cover 802 is, as noted, pre-manufactured with dimensions suitable for covering completely a particular component 302. Component cover 802 can be formed, folded or molded using any well-known technique suitable for the material used and intended application. With regard to materials, component cover 802 can be manufactured using any combination of non-conductive materials. For example, component cover 802 can be formed of polyethylene terephthalate (PETE), polyphenylsulfone (PPS) or RTV silicone rubbers, and polymers and synthetic rubbers such as TEFLON and VITON, among others. (TEFLON and VITON are registered trademarks of E. I. Du Pont de Nemours and Company.)

In alternative embodiments, component cover 802 is configured to provide access to component 302 without severing component cover 802. For example, in one alternative embodiment, component cover 802 is formed with an aperture at top 806 and includes in combination a cover, beveled insert or the like that can be removeably inserted into the aperture. To gain access to component 302, conformal EMI shield 100 around the beveled insert is scored and the insert removed. When component cover 802 is to be subsequently shielded, the beveled insert is reintroduced into the aperture and conformal EMI shield 100 is reapplied to component cover 802.

Thus, the low profile, non-electrically conductive component covers 802 enable components 302 to be shielded with conformal EMI shield 100 located at a location immediately adjacent to the components, in the near or induction field. In addition, component cover 802 does not provide any EMI shielding function, enabling a myriad of materials and manufacturing techniques to be used make such covers.

Figure 11:
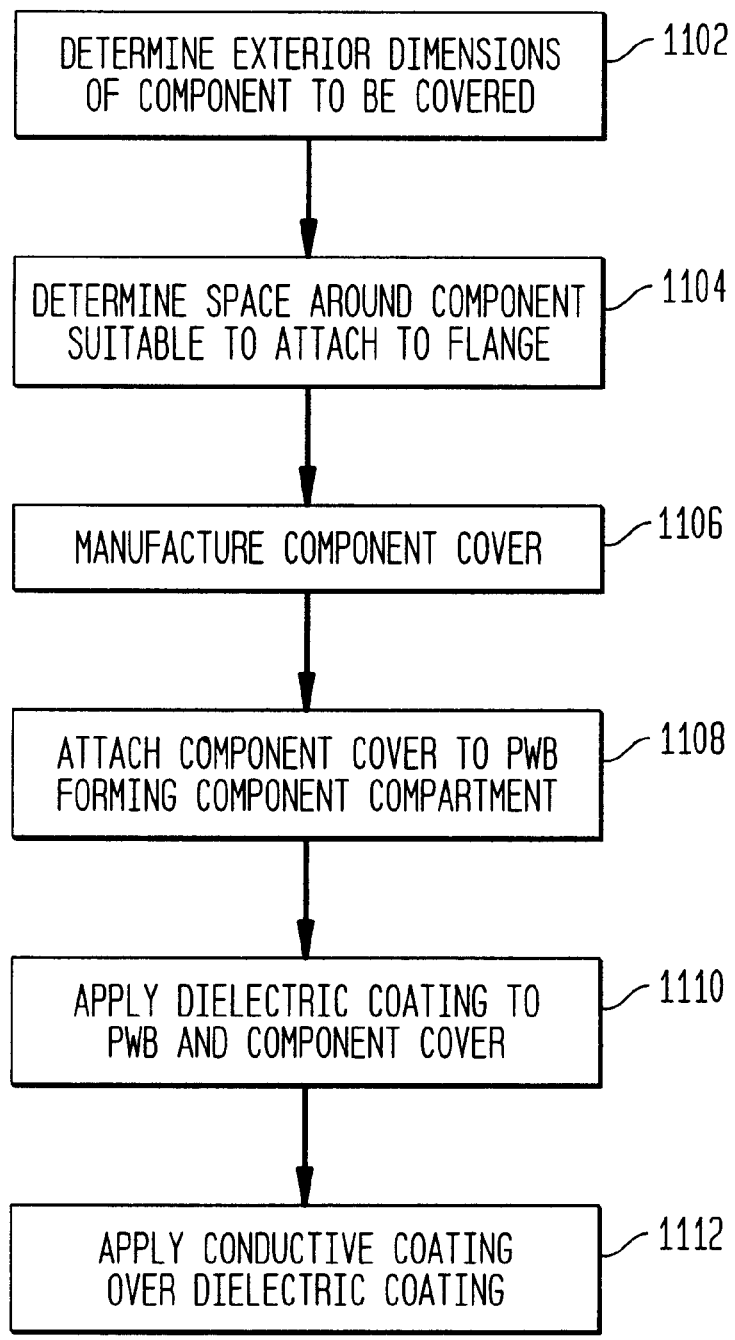
FIG. 11 is a flow chart of the primary operations performed in utilizing a component cover shown in FIGS. 8A–8E with the conformal EMI shield introduced in FIG. 1.

FIG. 11 is a flow chart of the primary operations performed in utilizing a component cover shown in FIGS. 8A–8E with conformal EMI shield of the present invention. At block 1102 the exterior dimensions of the component is determined. This includes all features of the component, including leads, heat sinks, etc. this information is used to determine the shape and size of dome 822 of component cover 802. Similarly, to determine the appropriate dimensions of flange 812, the space around the component is measured at block 1104. From this measurement, the size and shape of flange 812, including the configuration of bottom surface 814 are determined.

At block 1106 the component cover 802 is manufactured based on the dimensions determined at blocks 1102 and 1104. Alternatively, component 302 and component cover 802 can be specified prior to the manufacturing of printed wiring board 202. In such embodiments, printed wiring board 202 is manufactured to accommodate flange 812 of component cover 802.

The component compartment 804 is formed at block 1108. Here, component cover 802 is attached to printed wiring board 202 to form component compartment 804 dimensioned to encase component 302. Component compartment 804 is preferably evacuated or filled with a suitable inert atmosphere and sealed to maintain the environment at least until dielectric coating 102 is applied to component cover 802.

Conformal EMI shield 100 is applied at blocks 1110 and 1112. At block 1110, dielectric coating 102 is applied to printed wiring board 202 and the exterior surface of component cover 802. The manner in which dielectric coating 102 is applied is described elsewhere herein. As noted, dielectric coating 102 can be applied in many layers each bonded with its neighboring layers to form dielectric coating 102. At block 1112, conductive coating 104 is applied to the surface of dielectric coating 102. Each step 1110 and 1112 includes a number of subsidiary steps to prepare the surface, cure the coating, etc. This is described in greater detail above. Thus, upon the completion of the operations noted in block 1112, a conformal EMI shield 100 is applied to the component 302 contained in the component compartment. Since the component compartment is constructed and arranged to have a low profile, it defines a volume not substantially different that the volume defined by the surface of the covered component. As a result, conformal EMI shield 100 remains in the induction region immediately adjacent to component 302.

6. Filler Material for Use With Board-Level Containment of Electromagnetic Emissions There are small gaps or spaces between component leads, neighboring components and between components 302 and printed wiring board 202 that are relatively small. These various spaces are referred to herein generally and collectively as "cavities." Such cavities may have more than one opening to the surface of the printed wiring board. For example, the space between the leads of a component and the component body and printed wiring board is considered to be a cavity. Such a cavity has an opening to the surface of the printed circuit board between neighboring leads. Significantly, dielectric coating 102 has a combination of properties that enables it to penetrate or access such cavities. Dielectric coating 102 attaches to the component and printed wiring board surfaces forming such cavities when applied via air atomizing techniques, as described above.

Figure 9A:
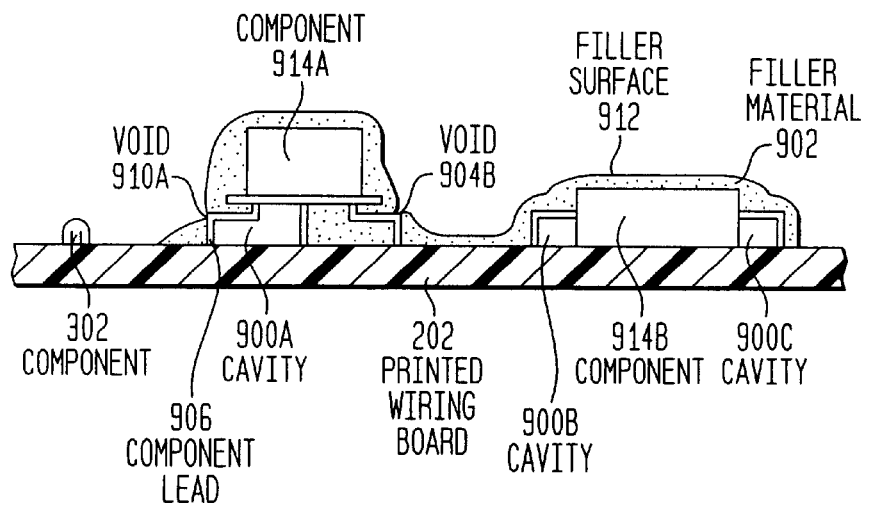
FIG. 9A is a cross-sectional view of a printed circuit board with a filler material applied to certain regions thereof in accordance with one embodiment of the invention to cover, encapsulate enclose or otherwise coat cavities on the printed circuit board, such as between the components and printed wiring board.

Although dielectric coating 102 sufficiently coats the component and board surfaces defining cavities, such surfaces are the more difficult surfaces to coat with conformal EMI shield 100. In one aspect of the invention, an alternative approach is taken. A non-electrically-conductive high viscosity material is applied to specific regions of printed circuit board 304 to further insure cavities on the printed circuit board are insulated prior to application of conductive coating 104. This aspect of the invention will be described with reference to FIGS. 9A–9D. FIG. 9A is a cross-sectional view of two components 302 mounted on a printed wiring board 202. In this example, one cavity 900A is located below the bottom surface of raised component 914A while two additional cavities are beneath the leads 906 of component 914B.

Those components or groups of components 914 that have or form such cavities 900 with each other and/or printed wiring board 202 are covered at least partially with a viscous, non-electrically-conductive filler material 902. Filler material 902 bridges across the opening(s) of each cavity 900 to cover, enclose, encapsulate and seal the cavity. Oftentimes, the cavities 900 are also at least partially infilled with filler material 902. Referring to the exemplary application shown in FIG. 9A, for example, cavities 900A and 900B are infilled while cavity 900C is not. Regardless of whether a cavity 900 is infilled, however, a coating of tiller material 902 eliminates the requirement that dielectric coating 102 penetrate cavities 900 to coat component and board surfaces defining the cavity 900. In addition, filler material 902 can also be applied to highly variable surfaces of printed circuit board 304. Highly variable surfaces include surfaces having a surface tangent that experiences substantial changes in value and/or abrupt changes in sign over small regions.

Selective applications of filler material 902 converts the irregular and cratered printed circuit board surface to a contiguous surface having gradual transitions due to the covering of cavities and the smoothing of sharp and abrupt surfaces. In other words, a printed circuit board 304 having filler material 902 applied thereto has a surface tangent that does not change abruptly and which does not have cavities. Dielectric coating 102, when applied to components covered with filler material 902 will coat completely such components due to the contiguous, contoured surface provided by filler material surface 912. Thus, filler material 902 insures the successful insulation of printed circuit board 304 prior to the application of conductive coating 104.

Although the viscosity can vary, filler material 902 is preferably thixotropic, enabling it to be extruded into and over cavities 900 while covering the top, side and other surfaces of components 914. In one embodiment, filler material 902 is an epoxy such as any epoxy from the family of Bisphenol-A epoxies mixed with an amine hardner. In one particular embodiment, filler material 902 is an EMCAST, CHIPSHIELD, 3400–2500 and 3600 series epoxies available from Electronic Materials, Inc., Breckenridge, Colo. A thermally cured epoxy is preferred due to the inability to directly apply UV radiation to filler material 902 that is disposed in cavities 900 due to shadows cast by the components.

In another embodiment, a latex based non-electrically conductive coating, such as HumiSeal TS300 epoxy, sold under the tradename TEMPSEAL, available from HumiSeal, Woodside, N.Y. In contrast to the Bisphenol-A epoxies noted above, HumiSeal TS300 can be removed from printed circuit board 304 by manually peeling it from the component surfaces. In another embodiment, the epoxy ABLEBOND 9349K available from Tra-Con, Inc. is utilized as filler material 902. This epoxy is a gray, two-part epoxy manufactured with glass bead spacers to control the bond line thickness.

Figure 9B:
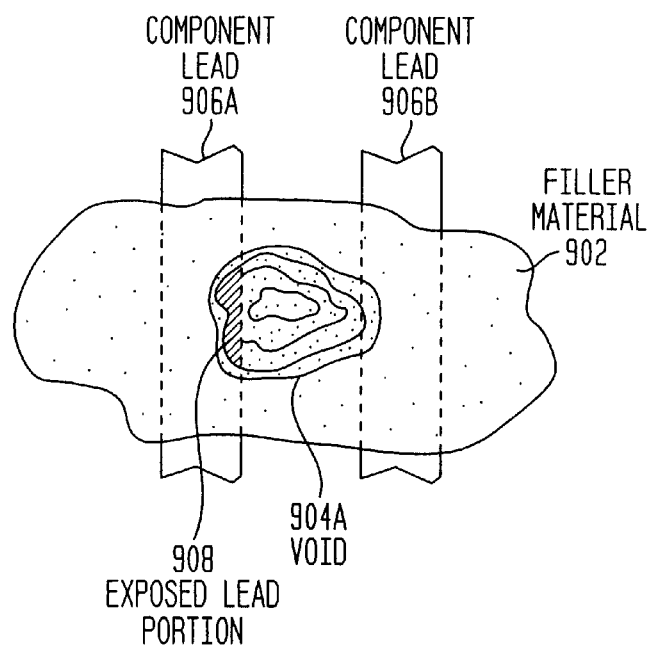
FIG. 9B is a top perspective view of a void formed in the filler material shown in FIG. 9A.
Figure 9C:
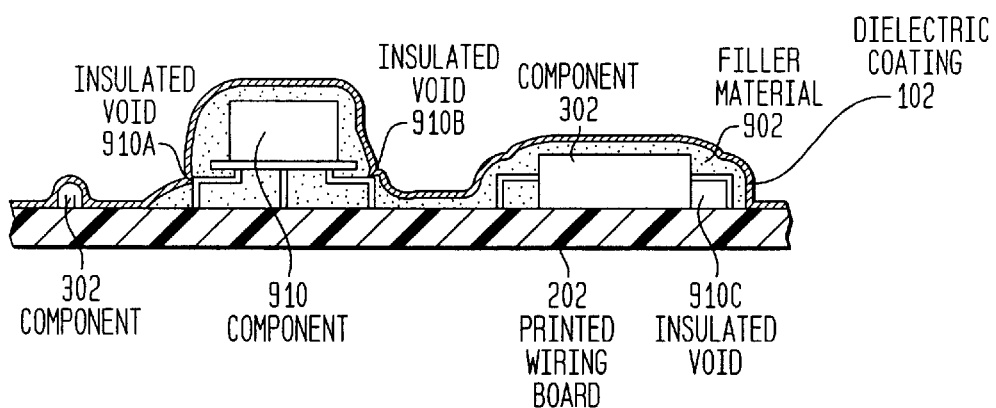
FIG. 9C is a cross-sectional view of a printed circuit board with the filler material applied thereto, as shown in FIG. 9A, with the dielectric coating of the present invention applied to the surface of the filler material and neighboring printed wiring board surfaces.
Figure 9D:
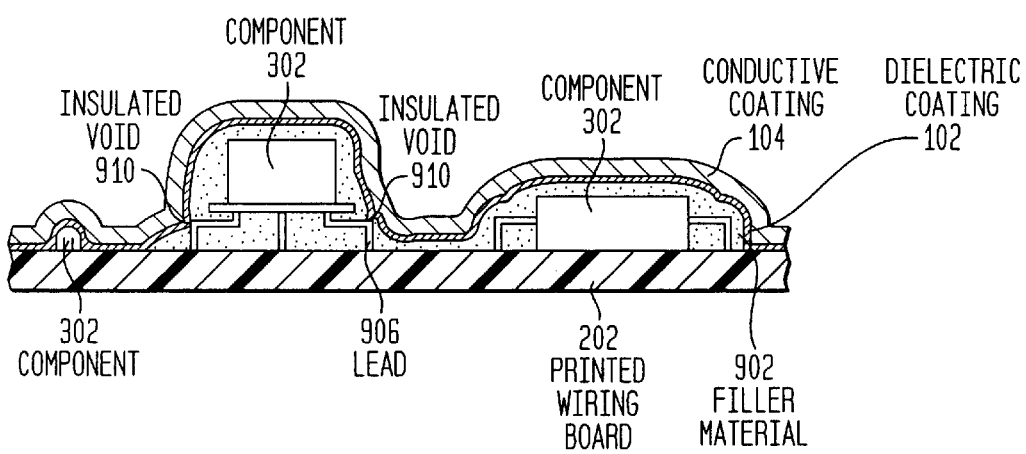
FIG. 9D is a cross-sectional view of the printed circuit board with a filler material and the dielectric coating applied thereto, as shown in FIG. 9C, with the conductive coating of the present invention applied to the surface of the dielectric coating to form the conformal EMI shield of the present invention.

It should be understood that due to variations in material, surface cavity configuration, application technique or a combination thereof, filler material 902 may cure with one or more voids. For example, referring to FIG. 9A, filler material 902 did not bridge completely across neighboring leads 906 in certain locations, forming voids 904A and 904B. FIG. 9B is a top view of void 904A. As shown, filler material 902 fills the cavity 900A between and below neighboring leads 906. Void 904A extends into the space between leads 906, exposing a portion 908 of lead 906A. If conductive coating 104 were to be applied to filler surface 912, void 904A would result in a short circuit of the exposed component lead 908. Thus, although such a circumstance can be eliminated through controlled processes, dielectric coating 102 is preferably applied to all surfaces of printed circuit board 304, including surface 912 of filler material 902. This insures that voids 904, if any, are completely insulated from the subsequently applied conductive coating 104. FIG. 9C is a cross-sectional view of the components shown in FIG. 9A, with a dielectric coating 104 applied to filler surface 912 of filler material 902 and the surface of printed wiring board 202. As shown in FIG. 9C, dielectric coating 104 covers completely surface 912 of filler material 902, including voids 904. As used herein, such voids, when coated with dielectric coating 104, are referred to as insulated voids 910. Application of conductive coating 104, as shown in FIG. 9D, results in a conformal EMI shield 100 that completely covers, while being electrically isolated from, printed circuit board 304.

It should be understood that the method for applying filler material 902 is a function of the selected material and specified by the manufacturer. Other operations may be included as well. For example, to avoid the formation of air pockets within or below the filler material 902 adjacent to components, the surface to be coated is subjected to negative pressure prior to the application of filter material 902. This eliminates the possibility of trapping air where it could corrode component surfaces. It should also be understood that multiple filler materials 902 can be incorporated into an EMI protected printed circuit board, for example, when different filler materials have different combinations of viscosity, thermal conduction and other properties each suitable for coating different components.

7. Manufacturing of Printed Circuit Board With Conformal EMI Shield

Figure 10:
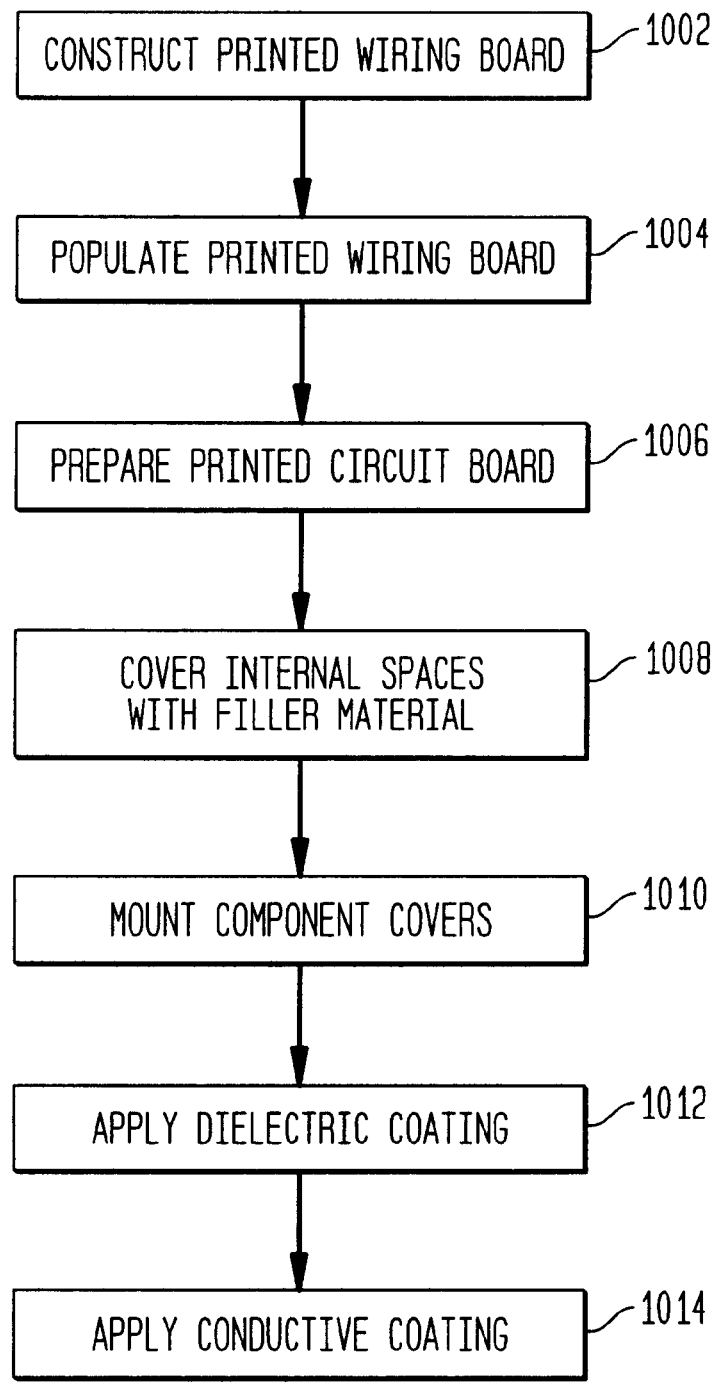
FIG. 10 is a flow chart of the operations performed to manufacture an EMI-shielded printed circuit board in which component covers and filler material are utilized with the conformal EMI shield in accordance with one embodiment of the present invention.

FIG. 10 is a flow chart of the primary operations performed in accordance with one embodiment of the present invention to form a printed circuit board with a conformal EMI shield coating at least a portion thereof. In the exemplary process 1000 that follows the printed circuit board is completely covered by conformal EMI shield 100.

Printed circuit board 304 is manufactured in steps or blocks 1002 and 1004. In block 1002 printed wiring board 202 is formed. Printed wiring board 202 may include surface traces designed to transfer signals while coated with conformal EMI shield 100. Further, printed wiring board 202 is constructed with ground pads in predetermined locations to be connected to conductive layer 104. Optionally, printed wiring board 202 may also include a series of ground vias located along the periphery of printed wiring board 202 to insure the electrical continuity of conformal EMI shield 100. At block 1004 printed wiring board 202 is populated with components to form one or more circuits, the sum of which is printed circuit board 304.

Printed circuit board 304 is then prepared for the application of conformal EMI shield 100 at block 1006. For example, soldering residues that may interfere with the ability of dielectric coating 104 to adhere to printed circuit board 304 are preferably washed off printed circuit board 304.

At block 1008 highly viscous filler material 902 is applied to predetermined components to fill and cover cavities thereof, as well as cavities between neighboring components and between components and printed wiring board 202. Filler material 902 may cover or encapsulate the component (s) or group of components. Filler material 902 can be applied using any well known extrusion technique that will not damage the covered components 302.

At block 1010 one or more component covers 802 are mounted on printed wiring board 202 to cover certain, predetermined components. As noted such components include those that are fragile or expensive and for which access need be provided without interference from conformal EMI shield 100.

Dielectric and conductive coatings 102, 104 are applied at blocks 1012 and 1014, respectively. One embodiment of the selected materials and associated application process, are described above. Both, dielectric coating 102 and conductive coating 104 are likely applied to predetermine regions of printed circuit board 304. This can be achieved by masking the printed circuit board 304 or by using a precision spray application technique, selectively applying coatings 304 to the desired regions of printed circuit board 304. For example, when masking is used, after dielectric coating 102 has cured, any masking unique to dielectric coating 102 is removed. Printed circuit board 304 is re-masked as necessary to prevent conductive coating 104 from shorting out connector contacts, etc. Thereafter, this masking is also removed from printed circuit board 304.

8. Closing

While various embodiments of the present invention have been described above, it should be understood that they have been presented by way of example only, and not limitation. For example, although air atomization spray techniques are commonly used, the present invention can be applied to printed circuit boards 304 using other gases such as nitrogen. As another example, it has been disclosed that conformal EMI shield 100 is preferably grounded, such as to ground plane 404 in printed wiring board 404. It should be appreciated, however, that conformal EMI shield 100 may need to be connected electrically to any reference voltage of which ground is only one. Thus, the breadth and scope of the present invention should not be limited by any of the above-described exemplary embodiments, but should be defined only in accordance with the following claims and their equivalents.

What is claimed is:

1. A printed circuit board comprising:

a printed wiring board with at least one electronic component mounted thereon;

a non-electrically-conductive component cover having a recess adapted to receive a selected one of said at least one electronic component, wherein said component cover is attached to the printed wiring board to form with said printed wiring board a component compartment that completely encases said selected component wherein said component cover is constructed such that a removable portion of said component cover can be severed and at least partially separated from a remaining portion of said component cover to provide access to said selected component; and a conformal coating applied to the printed circuit board subsequent to said component cover, wherein said conformal coating coats surfaces of said printed circuit board including said component cover and portions of said printed wiring board surrounding said component cover, wherein said component compartment prevents said conformal coating from contacting said selected component.

2. The printed circuit board of claim 1, wherein said component cover includes at least one line of severability that traverses said component cover to define said removable portion of said component cover.

3. The printed circuit board of claim 2, wherein said line of severability is a line of weakening that facilitates at least partially severing said removable portion of said component cover from said remaining portion of said component cover.

4. The printed circuit board of claim 1, wherein said component cover is pressure-rupturable along said line of severability.

5. The printed circuit board of claim 1, wherein said component compartment is air-tight.

6. The printed circuit board of claim 1, wherein said component compartment is evacuated.

7. The printed circuit board of claim 1, wherein said component compartment is filled with an inert atmosphere.

8. The printed circuit board of claim 1, wherein said component cover comprises:

a dome having a closed top, an open bottom remote from said top, and walls extending between said closed top and said open bottom to form said recess; and a flange, extending around a periphery of said dome, configured to be attached to the printed wiring board surrounding said selected component.

9. The printed circuit board of claim 8, wherein said component cover comprises a line of severability that traverses said component cover at or adjacent to a junction between said dome and said flange.

10. The printed circuit board of claim 8, wherein said dome and flange form a unitary component cover.

11. The printed circuit board of claim 8, wherein said component cover has an arbitrary shape.

12. The printed circuit board of claim 1, wherein said recess of said cover has a volume not substantially greater than a volume defined by surfaces of the selected component.

13. The printed circuit board of claim 1, wherein said component compartment has a low-profile, contoured exterior surface.

14. The printed circuit board of claim 1, wherein said component cover is formed of one or more materials from the group consisting of polyethylene terephthalate (PETE), polyphenylsulfone (PPS) or RTV silicone rubbers, and polymers and synthetic rubbers such as TEFLON and VITON.

15. The printed circuit board of claim 1, wherein the conformal coating is a conformal EMI shield.

16. The printed circuit board of claim 15, wherein the conformal EMI shield comprises:

a dielectric layer; and a conductive layer adheringly disposed on said dielectric layer.

17. A method for preventing a selected printed circuit board (PCB) component from being coated with a conformal coating applied to the PCB, the method comprising:

manufacturing from at least one non-electrically-conductive material said component cover having a recess adapted to receive the selected component wherein said component cover is constructed such that a removable portion of said component cover can be severed and at least partially separated from a remaining portion of said component cover to provide access to said selected component;

positioning said component cover over the selected component such that said selected component is disposed in said recess;

attaching said component cover to a printed wiring board of the PCB to form with the printed wiring board a sealed component compartment that completely encases said selected component; and applying the conformal coating to the printed circuit board including the component compartment, wherein the conformal coating coats said component cover and regions of the printed wiring board surrounding said component cover, and wherein the component compartment prevents said conformal coating from coating said selected component.

18. The method of claim 17, wherein the sealed component compartment is air-tight, and wherein the method further comprises:

evacuating said component compartment.

19. The method of claim 18, wherein the sealed component compartment is air-tight, and wherein the method further comprises:

filling said component compartment with an inert gas.

20. A printed circuit board comprising:

a printed wiring board;

a plurality of components mounted on said printed wiring board;

a component cover mounted on said printed wiring board over a selected component to define with the printed wiring board a sealed component compartment that encases said selected component; and a conformal EMI shield coating surfaces of said component cover and regions of said printed wiring board surrounding said selected component, and not coating surfaces of said selected component;

wherein a portion of said component cover can be severed and at least partially separated from a remaining portion of the said component cover to provide access to said selected component.

21. The printed circuit board of claim 20, wherein the component cover is formed of walls having a minimal thickness and an interior surface that is immediately adjacent to surfaces of said selected component.

22. The printed circuit board of claim 20, where said component cover is contoured to follow a contour of said selected component.

23. The printed circuit board of claim 20, wherein said component compartment is air-tight.

24. The printed circuit board of claim 20, wherein said component compartment is evacuated.

25. The printed circuit board of claim 20, wherein a line of severability traverses said component cover so as to define a said removable portion of said component cover.

26. The printed circuit board of claim 25, wherein said line of severability is a line of weakening that facilitates severing of said portion of said component cover from said remaining portion of said component cover.

27. The printed circuit board of claim 20, wherein said component cover has an arbitrary shape.

28. The printed circuit board of claim 20, wherein said component compartment said recess has a volume not substantially greater than a volume defined by surfaces of said selected component.

29. The printed circuit board of claim 20, wherein said component cover is formed of one or more materials from the group consisting of polyethylene terephthalate (PETE), polyphenylsulfone (PPS) or RTV silicone rubbers, and polymers and synthetic rubbers such as TEFLON and VITON.

* * * * *